US010785433B2

(12) United States Patent
Muto et al.

(10) Patent No.: US 10,785,433 B2
(45) Date of Patent: Sep. 22, 2020

(54) IMAGING SENSOR, IMAGING SYSTEM, AND MOVING BODY HAVING SIGNALS AMPLIFIED IN TWO DIFFERENT ACCUMULATION PERIODS

(71) Applicant: CANON KABUSHIKI KAISHA, Tokyo (JP)

(72) Inventors: Takashi Muto, Kawasaki (JP); Yasuharu Ota, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/181,926

(22) Filed: Nov. 6, 2018

(65) Prior Publication Data
US 2019/0089917 A1 Mar. 21, 2019

Related U.S. Application Data

(63) Continuation of application No. 15/614,313, filed on Jun. 5, 2017, now Pat. No. 10,158,816.

(30) Foreign Application Priority Data
Jun. 10, 2016 (JP) .................................. 2016-116559

(51) Int. Cl.
H04N 5/378 (2011.01)
H04N 5/355 (2011.01)
H04N 5/369 (2011.01)
H01L 27/146 (2006.01)
H04N 5/3745 (2011.01)
(Continued)

(52) U.S. Cl.
CPC ....... *H04N 5/369* (2013.01); *H01L 27/14609* (2013.01); *H04N 5/357* (2013.01); *H04N 5/35581* (2013.01); *H04N 5/378* (2013.01); *H04N 5/37452* (2013.01); *H04N 5/37457* (2013.01); *G06K 9/00791* (2013.01)

(58) Field of Classification Search
CPC .... H04N 5/335; H04N 5/35581; H04N 5/357; H04N 5/369; H04N 5/374; H04N 5/37452; H04N 5/37455; H04N 5/37457; H04N 5/353; H04N 5/378; H01L 27/14609; G06K 9/00791
See application file for complete search history.

(56) References Cited

U.S. PATENT DOCUMENTS 8,284,286 B2 * 10/2012 Mabuchi ............ H04N 5/35509
348/308
8,553,119 B2 * 10/2013 Hashimoto ............ H04N 5/378
250/214.1
8,786,745 B2 7/2014 Kawahito
(Continued)

FOREIGN PATENT DOCUMENTS

CN 1897639 A 1/2007
CN 102685516 A 9/2012
(Continued)

*Primary Examiner* — Ngoc Yen T Vu
(74) *Attorney, Agent, or Firm* — Canon U.S.A., Inc. IP Division

(57) ABSTRACT

An imaging sensor is configured to generate a signal that is obtained by amplifying one of a signal corresponding to a first accumulation period and a signal corresponding to a second accumulation period by using amplification factors having different values.

44 Claims, 23 Drawing Sheets

(51) Int. Cl.
*H04N 5/357* (2011.01)
*G06K 9/00* (2006.01)

(56) References Cited

U.S. PATENT DOCUMENTS

| | | | |
|---|---|---|---|
| 9,185,369 B2* | 11/2015 | Abe | H04N 5/3765 |
| 9,843,746 B2* | 12/2017 | Koshkin | H04N 5/2352 |
| 2003/0038542 A1 | 2/2003 | Duong | |
| 2007/0013798 A1* | 1/2007 | Ahn | H04N 5/335 |
| | | | 348/308 |
| 2010/0321532 A1* | 12/2010 | Hashimoto | H04N 5/2351 |
| | | | 348/234 |
| 2011/0292264 A1 | 12/2011 | Kubo | |
| 2013/0181118 A1* | 7/2013 | Koizumi | H04N 5/3559 |
| | | | 250/208.1 |
| 2018/0295274 A1* | 10/2018 | Nakayama | H04N 5/2253 |
| 2018/0376083 A1* | 12/2018 | Ikuma | G02B 26/10 |

FOREIGN PATENT DOCUMENTS

| | | |
|---|---|---|
| JP | 2008-167004 A | 7/2008 |
| JP | 2009-284181 A | 12/2009 |
| JP | 2011-120093 A | 6/2011 |
| WO | 2011/096340 A1 | 8/2011 |

\* cited by examiner

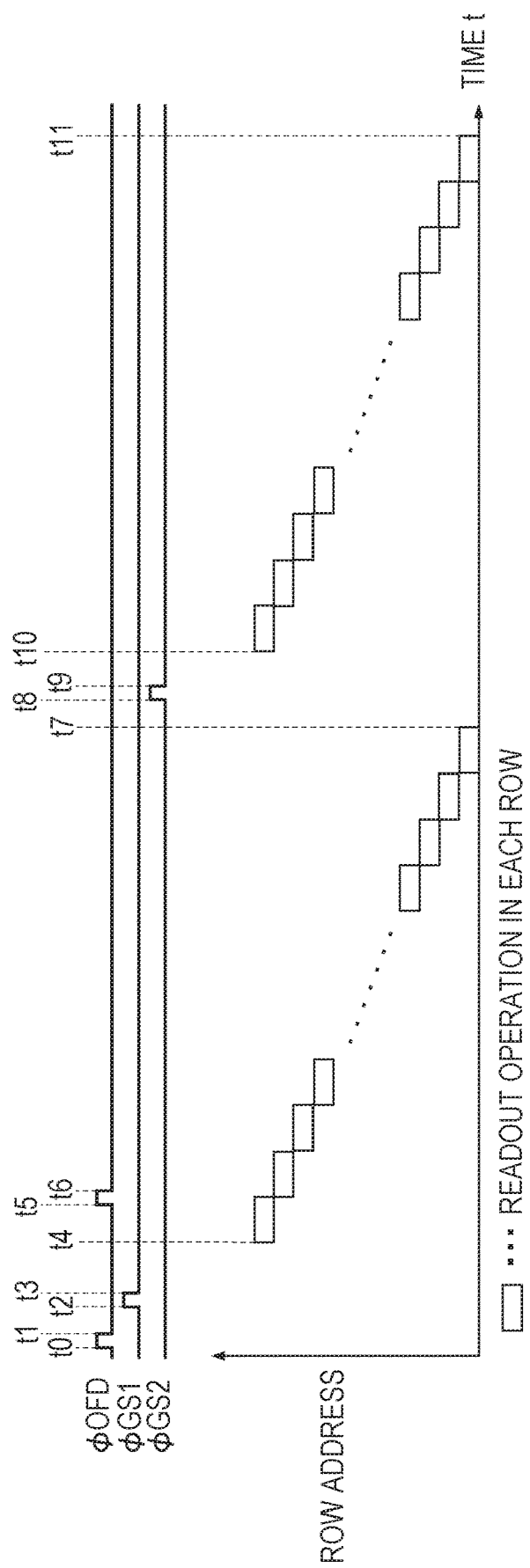

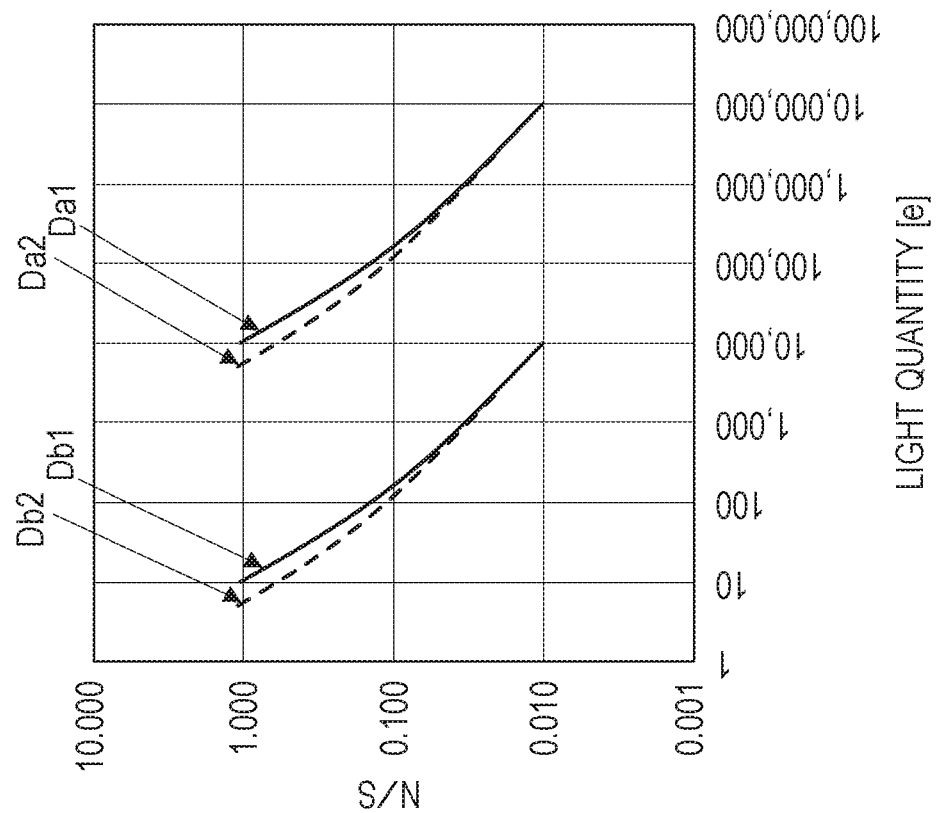
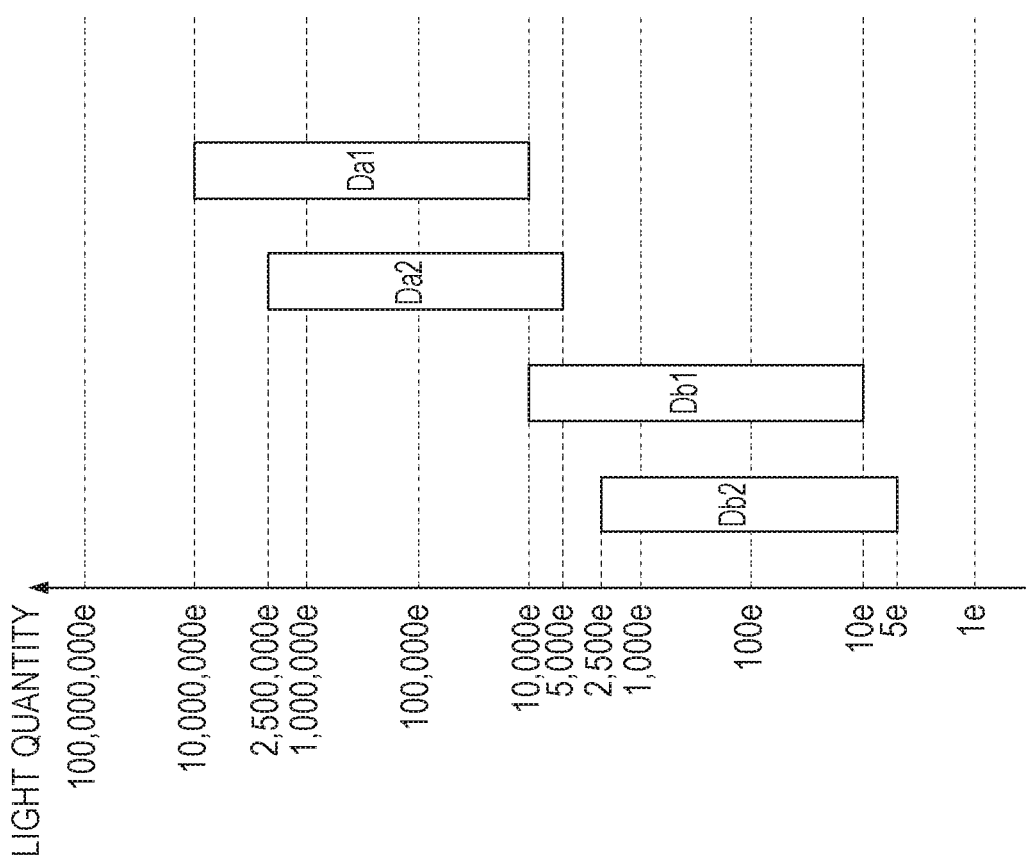

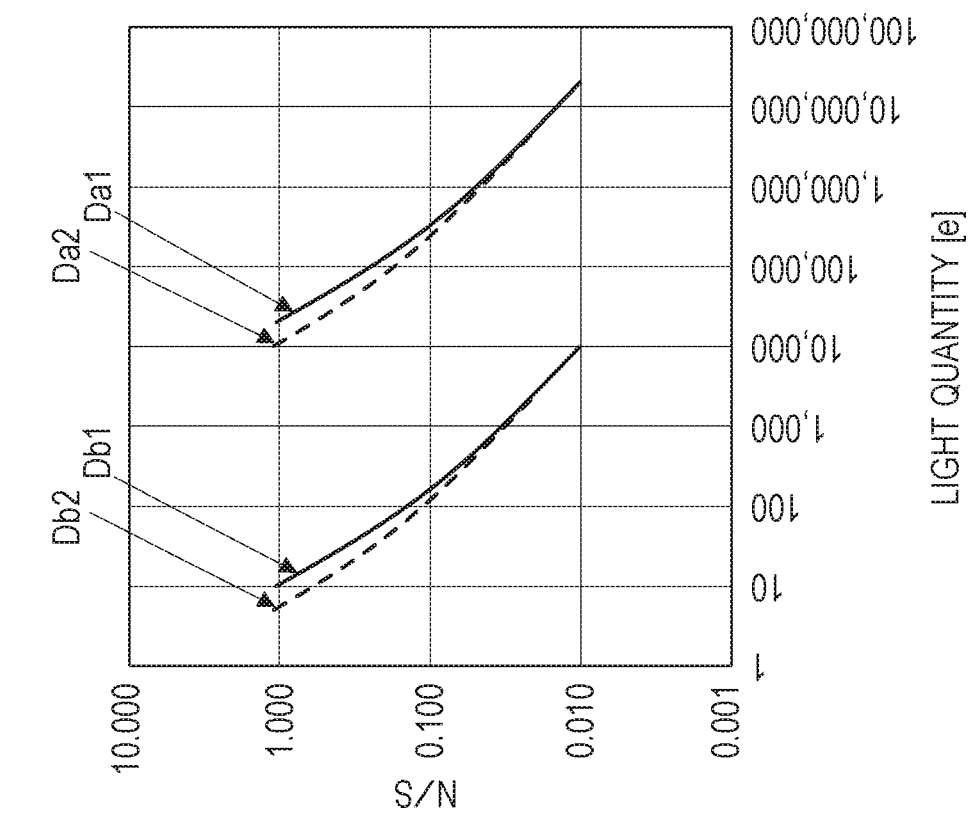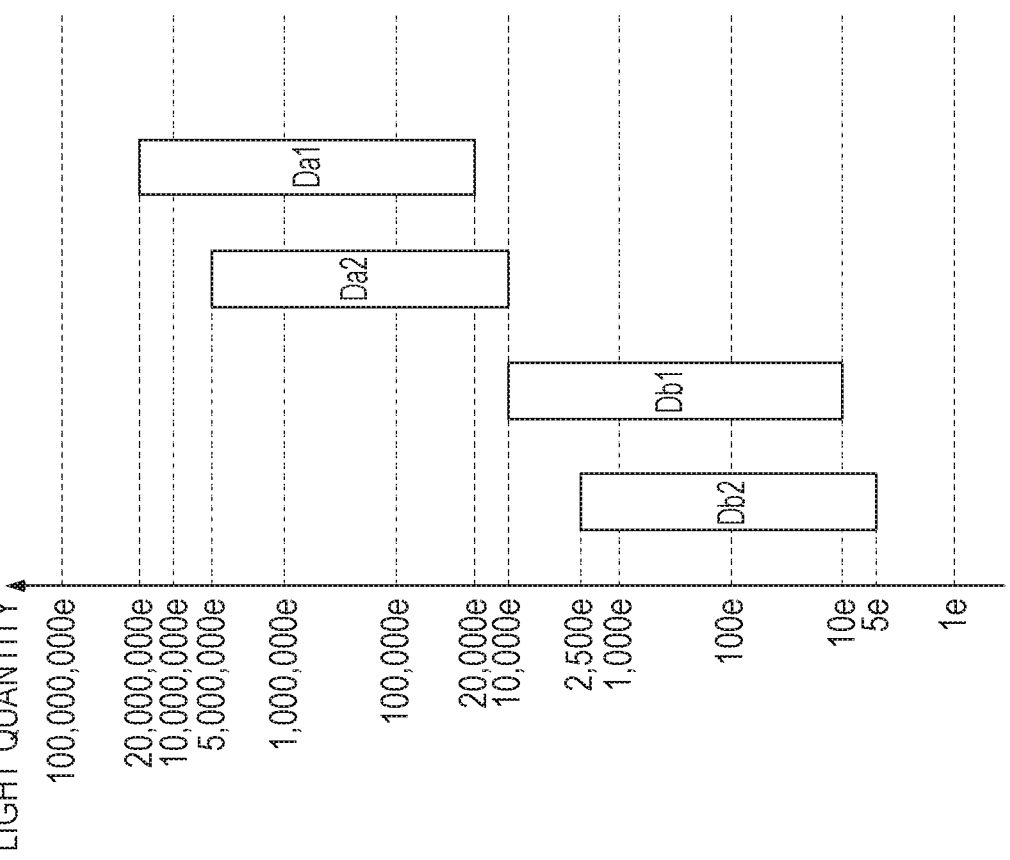

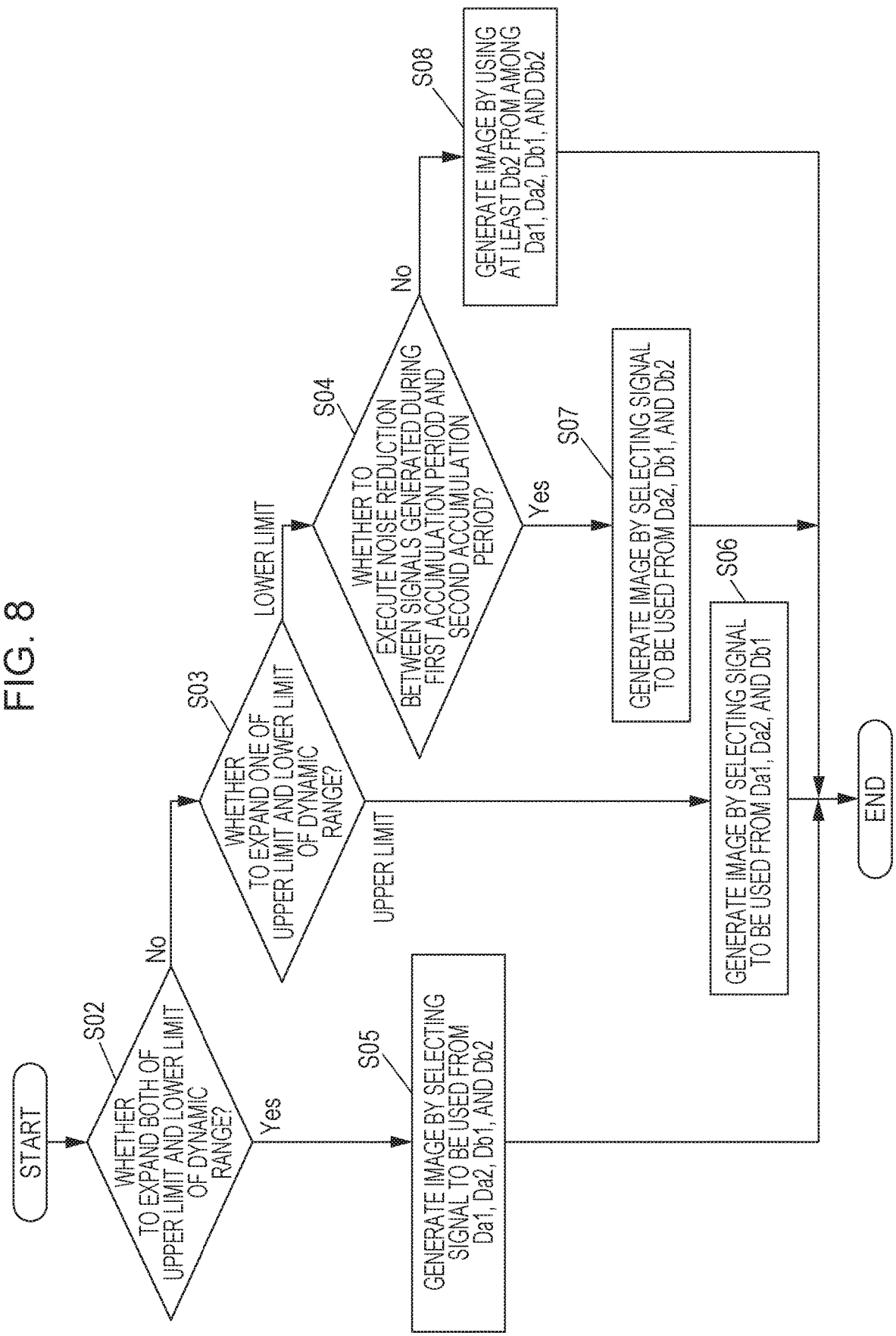

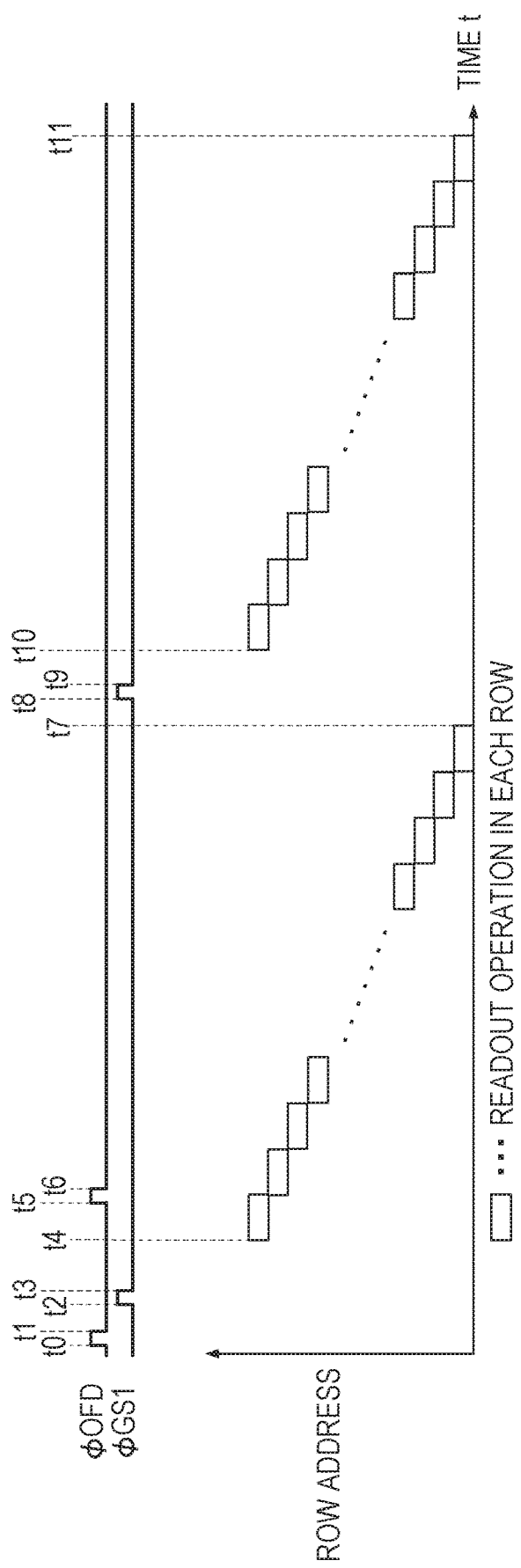

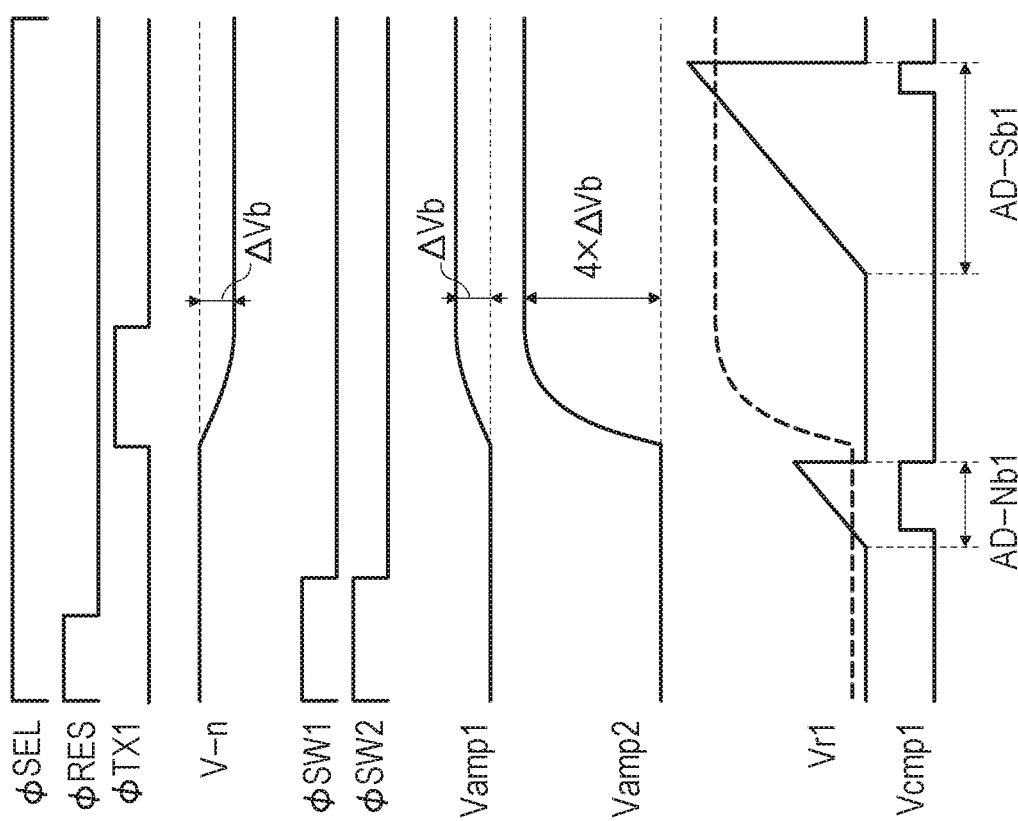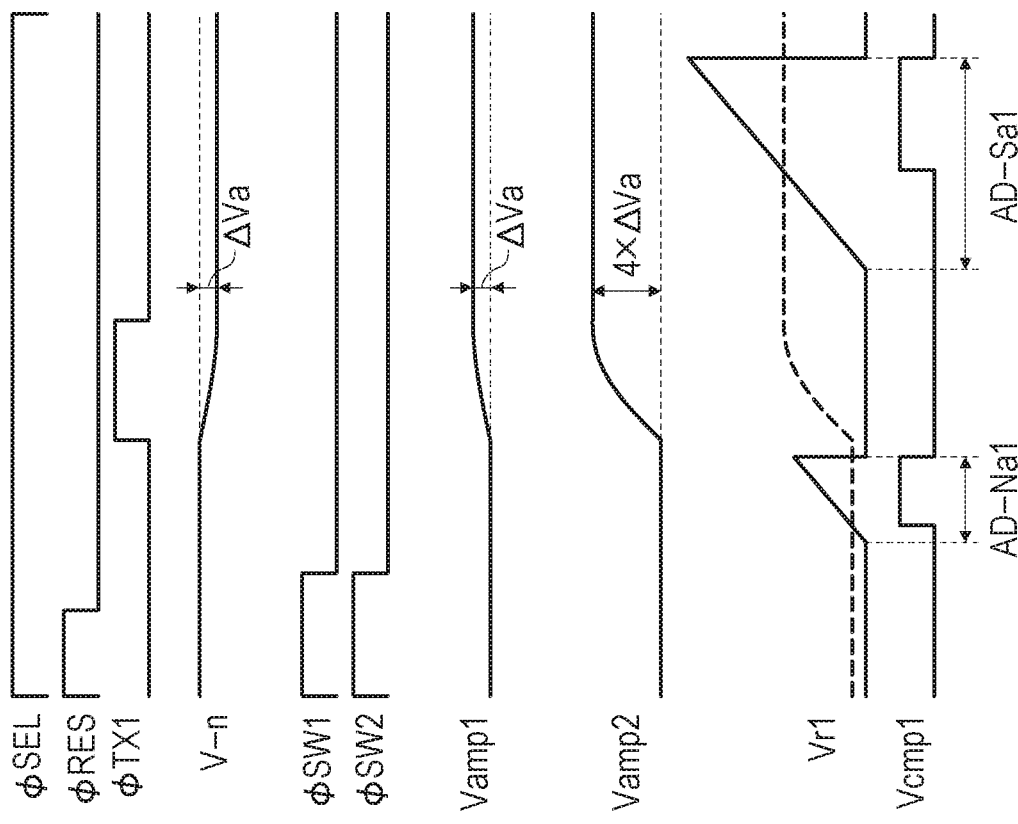

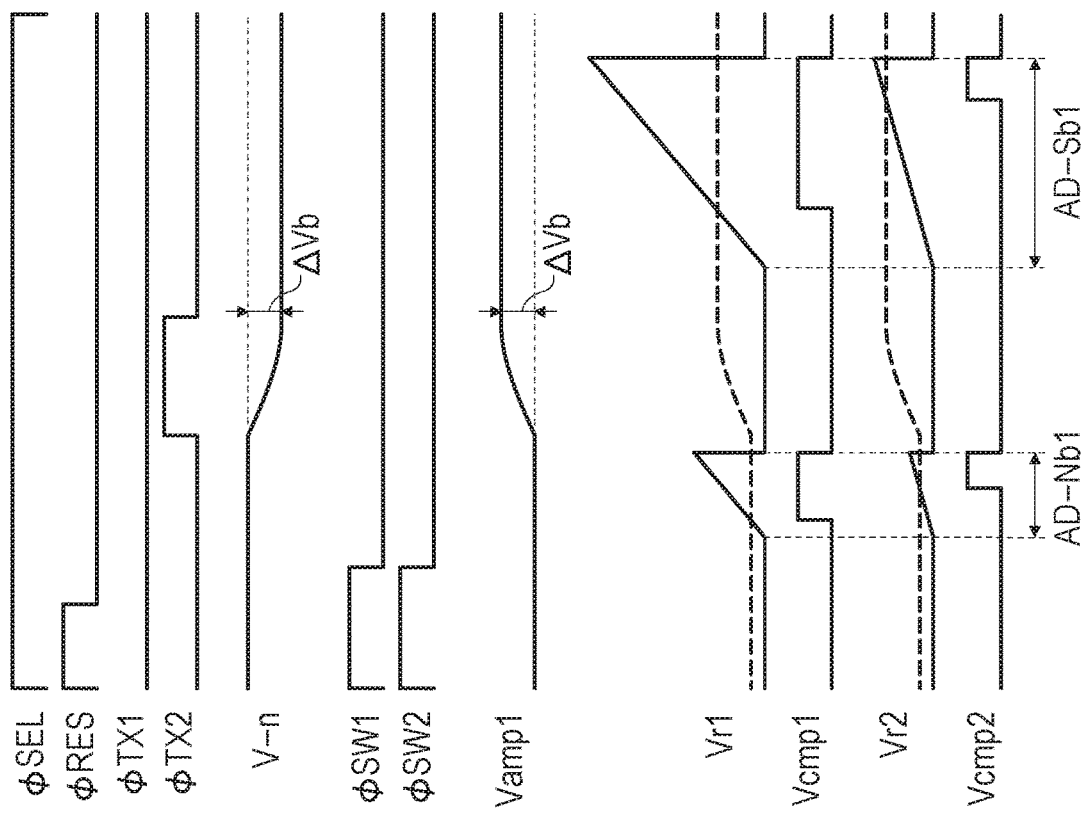
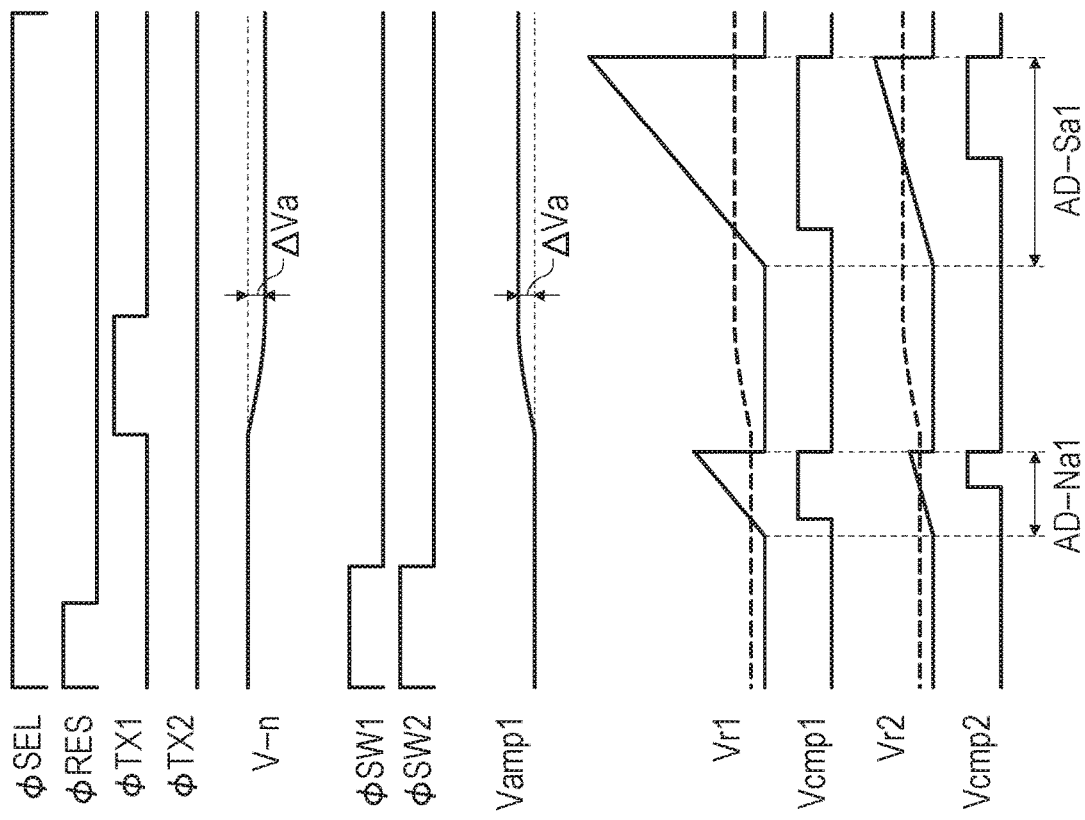

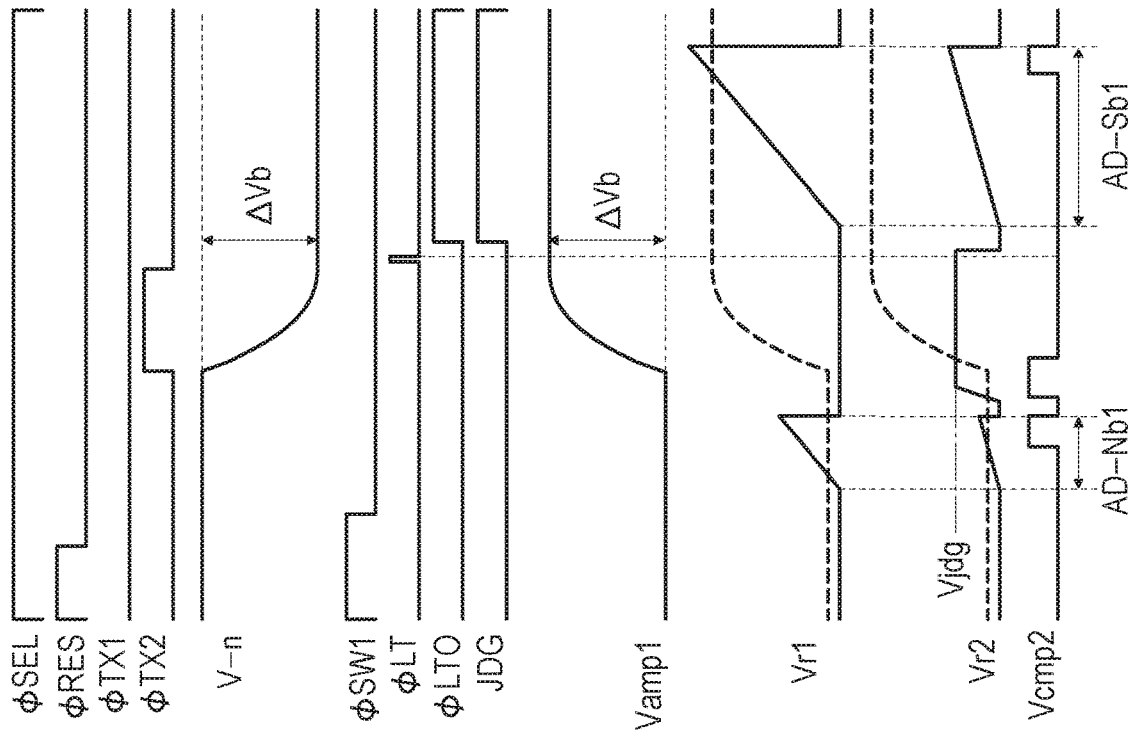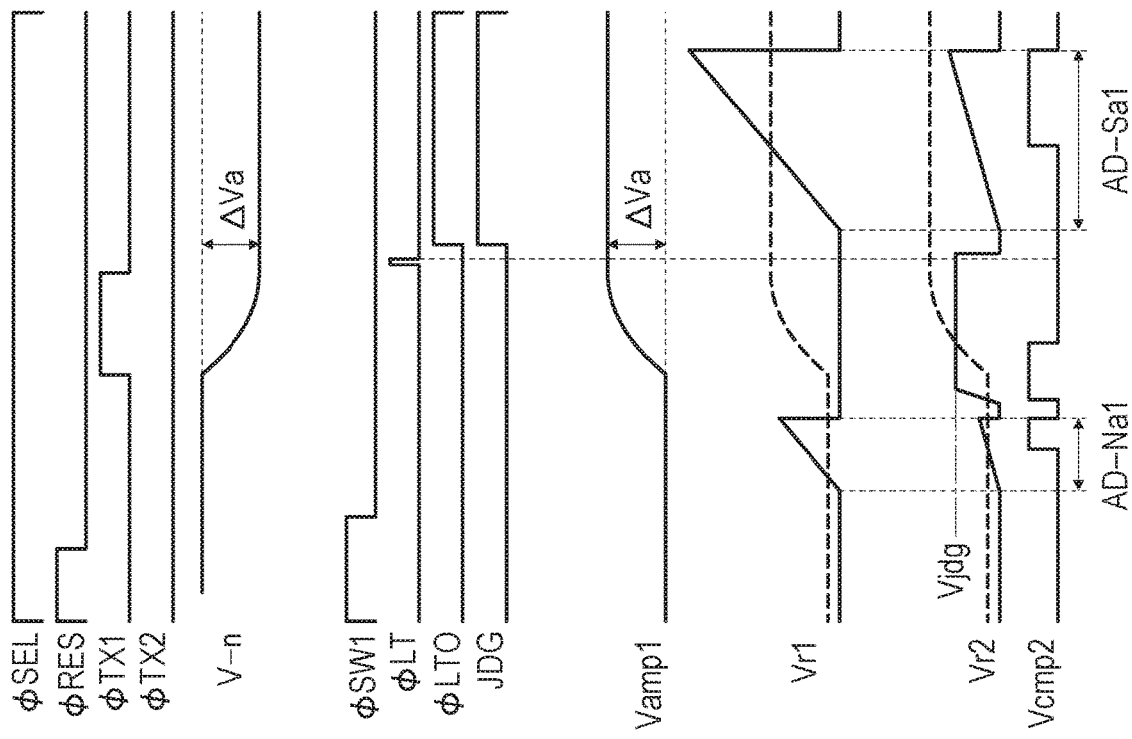

IMAGING SENSOR, IMAGING SYSTEM, AND MOVING BODY HAVING SIGNALS AMPLIFIED IN TWO DIFFERENT ACCUMULATION PERIODS

CROSS-REFERENCE TO RELATED APPLICATION

This application is a Continuation of U.S. application Ser. No. 15/614,313, filed Jun. 5, 2017, which claims priority from Japanese Patent Application No. 2016-116559 filed Jun. 10, 2016, which are hereby incorporated by reference herein in their entireties.

BACKGROUND OF THE INVENTION

Field of the Invention

One disclosed aspect of the embodiments relates to an imaging sensor, an imaging system, and a moving body.

Description of the Related Art

An imaging sensor provided with a plurality of pixels arranged in a plurality of rows and a plurality of columns has been proposed.

An imaging sensor that performs a global electronic shutter in which exposure start and exposure end are controlled by an electronic shutter in a plurality of pixels at the same time has also been proposed.

An imaging sensor described in International Publication No. 2011/096340 has the following configuration. In the imaging sensor that performs the global electronic shutter, a pixel is provided with a photodiode and a plurality of signal holding units.

In the imaging sensor according to International Publication No. 2011/096340, one of the plurality of signal holding units holds a signal accumulated during a first accumulation period by the photodiode, and the other one of the plurality of signal holding units holds a signal accumulated during a second accumulation period that is longer than the first accumulation period by the photodiode. When an image signal corresponding to the signal accumulated during the first accumulation period and an image signal corresponding to the signal accumulated during the second accumulation period are synthesized with each other, a dynamic range of the image can be expanded.

In the imaging sensor described in International Publication No. 2011/096340, an amplification factor of a column circuit unit to which a signal output from a pixel is input in the imaging sensor provided with the global electronic shutter function has not been discussed.

SUMMARY OF THE INVENTION

An imaging sensor according to an aspect of exemplary embodiments includes: a plurality of pixels, a control unit, and a plurality of column circuit units. The plurality of pixels is arranged in a plurality of columns, each pixel including a photoelectric conversion unit, a transfer unit, a signal holding unit, and a pixel output unit. The control unit is configured to control the plurality of pixels. The plurality of column circuit units is arranged so as to correspond to each of the plurality of columns and configured to generate a signal obtained by amplifying a signal output from the corresponding pixel. In the corresponding pixel, the photoelectric conversion unit respectively accumulates signals during a first accumulation period and a second accumulation period that is a period established separately from the first accumulation period and longer than the first accumulation period. The control unit respectively sets start and end of signal transfer from the photoelectric conversion unit to the photoelectric conversion unit by the transfer unit at the same time in the plurality of pixels. The pixel output unit outputs the signal corresponding to the first accumulation period and the signal corresponding to the second accumulation period. Each of the plurality of column circuit units generates a comparison result signal indicating a result of a comparison of one of the signal corresponding to the first accumulation period and the signal corresponding to the second accumulation period which are output from the corresponding pixel with a threshold. Each of the plurality of column circuit units changes an amplification factor for amplifying one of the signal corresponding to the first accumulation period and the signal corresponding to the second accumulation period in accordance with a signal level of the comparison result signal.

In addition, an imaging sensor according to another aspect of the exemplary embodiments includes a plurality of pixels, a control unit, and a plurality of column circuit units. The plurality of pixels are arranged in a plurality of columns, each pixel including a photoelectric conversion unit, a transfer unit, a signal holding unit, and a pixel output unit. The control unit is configured to control the plurality of pixels. The plurality of column circuit units is arranged so as to correspond to each of the plurality of columns and configured to generate a signal obtained by amplifying a signal output from the corresponding pixel. In the corresponding pixel, the photoelectric conversion unit respectively accumulates signals during a first accumulation period and a second accumulation period that is a period established separately from the first accumulation period and longer than the first accumulation period. The control unit respectively sets start and end of signal transfer from the photoelectric conversion unit to the photoelectric conversion unit by the transfer unit at the same time in the plurality of pixels. Each of the plurality of pixels outputs the signal corresponding to the first accumulation period and the signal corresponding to the second accumulation period. Each of the plurality of column circuit units generates a plurality of signals by amplifying one of the signal corresponding to the first accumulation period and the signal corresponding to the second accumulation period which are output from the corresponding pixel by a plurality of amplification factors having different values.

Further features of the disclosure will become apparent from the following description of exemplary embodiments with reference to the attached drawings.

BRIEF DESCRIPTION OF THE DRAWINGS

FIG. 4 illustrates an operation in one frame of the imaging sensor.
FIG. 6A illustrates a dynamic range of a signal generated by the imaging sensor.

FIG. 6B illustrates the dynamic range of the signal generated by the imaging sensor.

FIG. 7A illustrates the dynamic range of the signal generated by the imaging sensor.

FIG. 7B illustrates the dynamic range of the signal generated by the imaging sensor.

FIG. 8 is a flow chart illustrating a flow for selecting a signal used for an imaging system to generate an image.

FIG. 10 illustrates the operation in one frame of the imaging sensor.

FIG. 11A illustrates the detail of the operation related to the pixel in one row of the imaging sensor.

FIG. 11B illustrates the detail of the operation related to the pixel in one row of the imaging sensor.

FIG. 13A illustrates the detail of the operation related to the pixel in one row of the imaging sensor.

FIG. 13B illustrates the detail of the operation related to the pixel in one row of the imaging sensor.

FIG. 21A illustrates the detail of the operation related to the pixel in one row of the imaging sensor.

FIG. 21B illustrates the detail of the operation related to the pixel in one row of the imaging sensor.

DESCRIPTION OF THE EMBODIMENTS

The following exemplary embodiments relate to a technology with regard to the expansion of the dynamic range of the imaging sensor.

First Exemplary Embodiment

A first exemplary embodiment will be described with reference to the drawings.

Configuration of an Imaging Sensor

Figure 1:
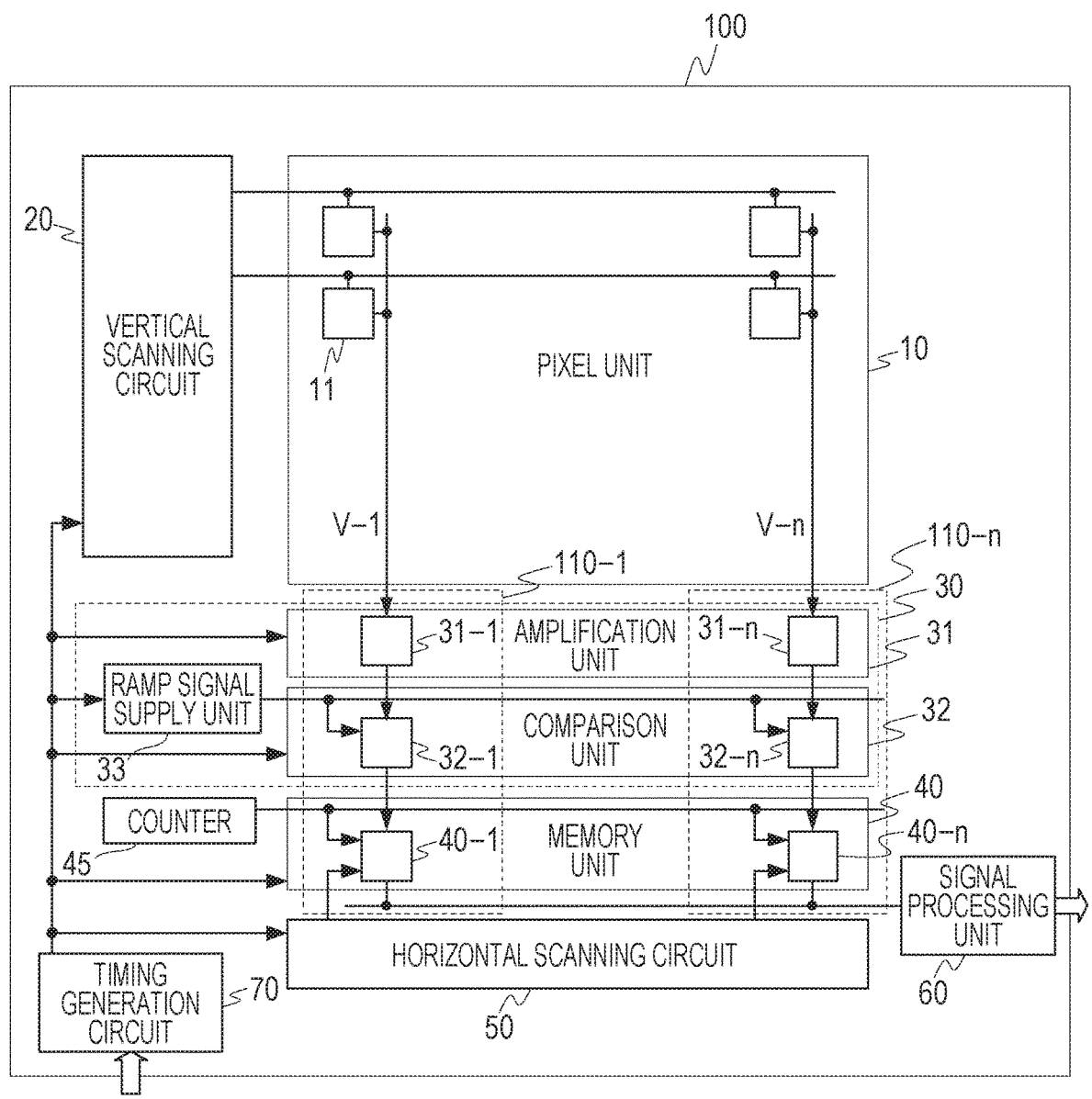
FIG. 1 illustrates a configuration of an imaging sensor.

FIG. 1 is a block diagram illustrating a configuration of an imaging sensor 100 according to the present exemplary embodiment. The imaging sensor 100 includes a pixel array 10, a vertical scanning circuit 20, a readout unit 30, a memory unit 40, a counter 45, a horizontal scanning circuit 50, a signal processing unit 60, and a timing generation circuit 70.

The pixel array 10 includes a plurality of pixels 11 arranged in a plurality of rows and a plurality of columns. Respective output nodes of the plurality of pixels 11 arranged in the same column in the pixel array 10 are connected to a common vertical signal line V-n. Herein, n denotes an integer and represents a column number counted from the left of the pixel array 10. In the following explanation, elements arranged so as to correspond to the columns of the pixels 11 arranged in the pixel array 10 are similarly represented. The vertical scanning circuit 20 sequentially selects the plurality of pixels 11 arranged in the pixel array 10 in units of row. As a result, the pixels 11 in the selected row output pixel signals to the vertical signal line V-n. The vertical scanning circuit 20 is a control unit configured to control readout of the pixel signal from the pixel 11. The vertical scanning circuit 20 functioning as the control unit controls a transfer unit (transfer transistor) included in the pixel 11 which will be described below. The readout unit 30 includes an amplification unit 31, a comparison unit 32, and a ramp signal supply unit 33. The amplification unit 31 includes the amplification unit 31-$n$ in each column and amplifies the pixel signal supplied from the respectively corresponding vertical signal line V-n. The ramp signal supply unit 33 outputs a ramp signal in which a signal level changes over time. The comparison unit 32 includes the comparison unit 32-$n$ in each column and outputs a comparison result of an output of the respectively corresponding amplification unit 31-$n$ and the ramp signal output from the ramp signal supply unit 33. The memory unit 40 includes a memory 40-$n$ in each column. The memory 40-$n$ receives the output of the respectively corresponding comparison unit 32-$n$ and holds a count signal output from the counter 45. For this reason, the count signal held in the memory 40-$n$ is equivalent to a digital signal corresponding to a signal level of the pixel signal. As a result, the pixel signal corresponding to an analog signal is subjected to analog-to-digital (AD) conversion to be converted into a digital signal. An AD conversion unit includes the comparison unit 32-$n$ and the memory unit 40-$n$. The horizontal scanning circuit 50 sequentially selects the memory 40-$n$ in each column. The memory 40-$n$ selected by the horizontal scanning circuit 50 transmits the held count signal to the signal processing unit 60. The signal processing unit 60 performs digital signal processing on the basis of the memory 40-$n$ in each column. It should be noted that the operations thus far performed by the pixel array 10, the vertical scanning circuit 20, the readout unit 30, the memory unit 40, and the horizontal scanning circuit 50 are controlled by the timing generation circuit 70.

The imaging sensor 100 includes a column circuit unit 110-$n$ each arranged so as to correspond to the column of the pixel 11. The column circuit unit 110-$n$ includes the amplification unit 31-$n$, the comparison unit 32-$n$, and the memory unit 40-$n$.

Configuration of the Pixel

Figure 2:
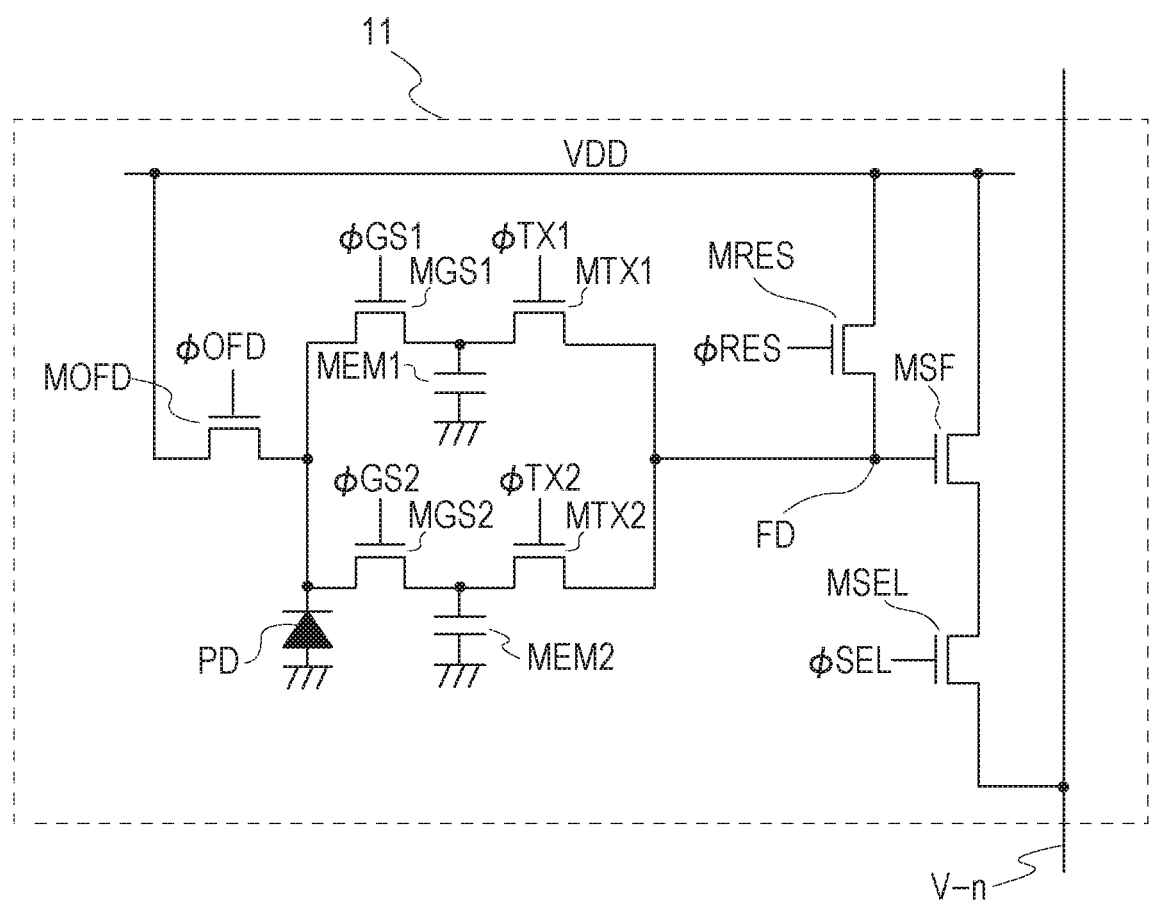
FIG. 2 illustrates a configuration of a pixel.

FIG. 2 illustrates a configuration of the pixel 11 according to the present exemplary embodiment. The pixel 11 includes a photoelectric conversion unit PD, a signal holding unit MEM1 and a signal holding unit MEM2, a discharge transistor MOFD, a transfer transistor MGS1 and a transfer transistor MGS2, a transfer transistor MTX1 and a transfer transistor MTX2, a reset transistor MRES, an amplification transistor MSF, and a selection transistor MSEL. An input node FD of the amplification transistor MSF is connected to the reset transistor MRES, the transfer transistor MTX1, and the transfer transistor MTX2. The transfer transistors MGS1 and MGS2 are transfer units configured to transfer signals generated by the photoelectric conversion unit PD to the signal holding units MEM1 and MEM2.

The photoelectric conversion unit PD performs photoelectric conversion of incident light. When a signal φOFD is set at an H level, the discharge transistor MOFD turns on, and the photoelectric conversion unit PD is reset to a potential corresponding to a power supply voltage VDD. When the signal φOFD is set at an L level, the discharge transistor MOFD turns off, and the signal (charges) photoelectrically converted by the photoelectric conversion unit PD is accumulated. When a signal φGS1 is set at the H level, the transfer transistor MGS1 turns on, and the signal (charges) accumulated in the photoelectric conversion unit PD is transferred to the signal holding unit MEM1. The signal holding unit MEM1 holds the transferred signal even after the signal φGS1 is set at the L level. When a signal φGS2 is set at the H level, the transfer transistor MGS2 turns on, and the signal (charges) accumulated in the photoelectric conversion unit PD is transferred to the signal holding unit MEM2. Similarly as in the signal holding unit MEM1, the signal holding unit MEM2 holds the transferred signal even after the signal φGS2 turns to the L level. When a signal φTX1 is set at the H level, the transfer transistor MTX1 turns on, and the signal held by the signal holding unit MEM1 is transferred to the input node FD. Similarly, when a signal φTX2 is set at the H level, the transfer transistor MTX2 turns on, and the signal held by the signal holding unit MEM2 is transferred to the input node FD. When a signal φSEL is set at the H level, the selection transistor MSEL turns on. A current source which is not illustrated in the drawing is connected to the vertical signal line V-n. Therefore, when the selection transistor MSEL turns on, the amplification transistor MSF performs a source follower operation on the basis of a current supplied from the current source and the power supply voltage VDD. That is, the power supply voltage VDD, the current source connected to the vertical signal line V-n, and the amplification transistor MSF constitute a source follower circuit. Therefore, the amplification transistor MSF outputs a signal based on a voltage of a floating diffusion FD to the vertical signal line V-n via the selection transistor MSEL. The amplification transistor MSF is a pixel output unit configured to output the signal based on the voltage of the floating diffusion FD. When a signal φRES is set at the H level, the reset transistor MRES turns on, and a potential of the floating diffusion FD is reset to a potential corresponding to the power supply voltage VDD.

Configurations of the Amplification Unit and the Comparison Unit

Figure 3:
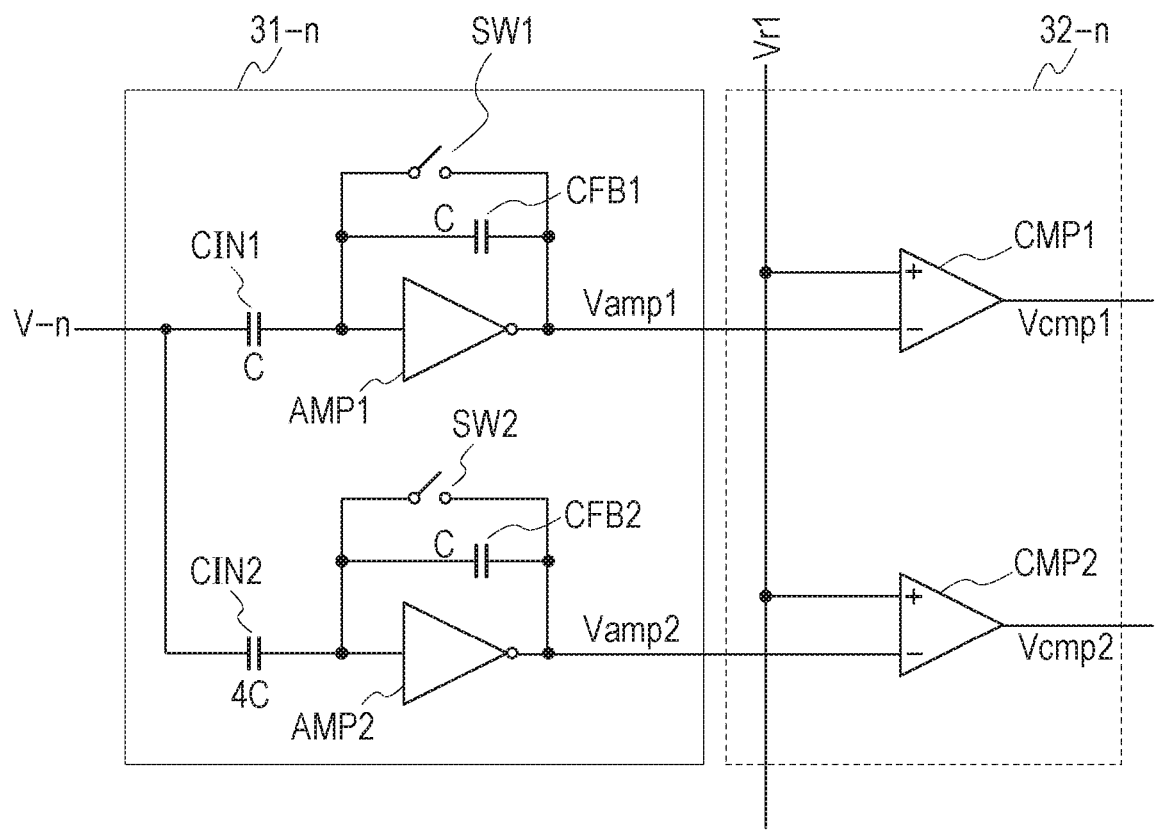
FIG. 3 illustrates configurations of an amplification unit and a comparison unit.

FIG. 3 illustrates configurations of the amplification unit 31-*n* and the comparison unit 32-*n* of according to the present exemplary embodiment.

The amplification unit 31-*n* includes an inverting amplifier circuit AMP1, an inverting amplifier circuit AMP2, a capacitor element CIN1, a capacitor element CIN2, a capacitor element CFB1, a capacitor element CFB2, a switch SW1, and a switch SW2.

The capacitor element CIN1 is an input capacitor element of the inverting amplifier circuit AMP1. The capacitor element CFB1 is a feedback capacitor element of the inverting amplifier circuit AMP1. When a signal φSW1 is at the H level, the switch SW1 turns on, and input and output of the inverting amplifier circuit AMP1 are short-circuited. As a result, charges of the capacitor element CIN1 and the capacitor element CFB1 are reset. At this time, the inverting amplifier circuit AMP1 outputs a signal at a reset level. When the signal φSW1 is at the L level, the switch SW1 turns off, and the input and output of the inverting amplifier circuit AMP1 are connected only via the capacitor element CFB1. Therefore, the pixel signal input from the vertical signal line V-n is amplified by the amplification factor determined by a ratio of capacitance values of the capacitor element CIN1 and the capacitor element CFB1 and output as a signal Vamp1 of the inverting amplifier circuit AMP1. The signal Vamp1 is an analog signal obtained by amplifying the pixel signal. Herein, both the capacitance values of the capacitor element CIN1 and the capacitor element CFB1 are the same C. Therefore, the pixel signal is amplified by the amplification factor of 1 time and output.

On the other hand, the capacitor element CIN2 is an input capacitor element of the inverting amplifier circuit AMP2. The capacitor element CFB2 is a feedback capacitor element of the inverting amplifier circuit AMP2. When the signal φSW2 is at the H level, the switch SW2 turns on, and input and output of the inverting amplifier circuit AMP2 are short-circuited. As a result, charges of the capacitor element CIN2 and the capacitor element CFB2 are reset. At this time, the inverting amplifier circuit AMP2 outputs a signal at a reset level. When the signal φSW2 is at the L level, the switch SW2 turns off, and the input and output of the inverting amplifier circuit AMP2 are connected only via the capacitor element CFB2. Therefore, as an output signal Vamp2 of the inverting amplifier circuit AMP2, the pixel signal input from the vertical signal line V-n is amplified by the amplification factor determined on the basis of a ratio of capacitance values of the capacitor element CIN2 and the capacitor element CFB2. Herein, capacitance values of the capacitor element CIN2 and the capacitor element CFB2 are respectively 4C and C. Therefore, the pixel signal is amplified by the amplification factor of 4 times and output.

In this manner, the amplification unit 31-*n* is provided with the inverting amplifier circuit AMP1 having the amplification factor of 1 time and the inverting amplifier circuit AMP2 having the amplification factor of 4 times.

The comparison unit 32-*n* includes a comparison circuit CMP1 and a comparison circuit CMP2. The comparison circuit CMP1 compares the signal Vamp1 output from the inverting amplifier circuit AMP1 with a ramp signal Vr1 output from the ramp signal supply unit 33. The comparison circuit CMP1 outputs an output signal Vcmp1 indicating this comparison result. The output signal Vcmp1 is at the L level when Vamp1≥Vr1 and at the H level when Vamp1<Vr1. Similarly, the comparison circuit CMP2 compares the output signal Vamp2 of the inverting amplifier circuit AMP2 with the ramp signal Vr1 output from the ramp signal supply unit 33. The comparison circuit CMP2 outputs an output signal Vcmp2 indicating this comparison result. The output signal Vcmp2 is at the L level when Vamp2≥Vr1 and at the H level when Vamp2<Vr1.

Operation of the Imaging Sensor

FIG. 4 is an operation timing chart of one frame according to the present exemplary embodiment.

At a time t0, the vertical scanning circuit 20 sets the signal φOFD at the H level. As a result, the photoelectric conversion unit PD is reset.

At a time t1, the vertical scanning circuit 20 sets the signal ϕOFD at the L level. As a result, the photoelectric conversion units PD in all the pixels 11 start the signal accumulation at the same time (electronic shutter operation).

During a period from a time t2 to a time t3, the vertical scanning circuit 20 sets the signal ϕGS1 at the H level. As a result, the signals accumulated by the photoelectric conversion units PD in all the pixels 11 are transferred to the signal holding unit MEM1 at the same time (global transfer operation). The accumulation from the time t1 until the time t3 will be referred to as a first accumulation period Texpa.

Subsequently, the vertical scanning circuit 20 starts vertical scanning at a time t4. As a result, the pixel signals corresponding to the first accumulation period Texpa are output to the vertical signal line V-n from the pixels 11 in the respective rows.

At a time t5, the vertical scanning circuit 20 sets the signal ϕOFD at the H level and resets the photoelectric conversion unit PD in parallel with the readout operation for each row. Then, at a time t6, the vertical scanning circuit 20 sets the signal ϕOFD at the L level. As a result, the photoelectric conversion units PD in all the pixels 11 start the signal accumulation again (electronic shutter operation).

From a time t8 until a time t9, the vertical scanning circuit 20 sets the signal ϕGS2 at the H level. As a result, in all the pixels 11, the signals accumulated by the photoelectric conversion units PD are transferred to the signal holding unit MEM2 at the same time (global transfer operation). The accumulation from the time t6 until the time t9 will be referred to as a second accumulation period Texpb. The second accumulation period Texpb is a period longer than the first accumulation period Texpa. In addition, the first accumulation period Texpa and the second accumulation period Texpb have a relationship in which the periods are not overlapped with each other at all. According to the present exemplary embodiment, a length of the second accumulation period Texpb is 1000 times as long as a length of the first accumulation period Texpa.

At a time t10, the vertical scanning circuit 20 performs the vertical scanning similarly as in the vertical scanning performed during a previous period from the time t4 until the time t7. As a result, the pixel signals corresponding to the second accumulation period Texpb are output to the vertical signal line V-n from the pixels 11 in the respective rows.

Subsequently, a readout operation for reading out the pixel signal from the pixel 11 in one row will be described.

Figure 5A:
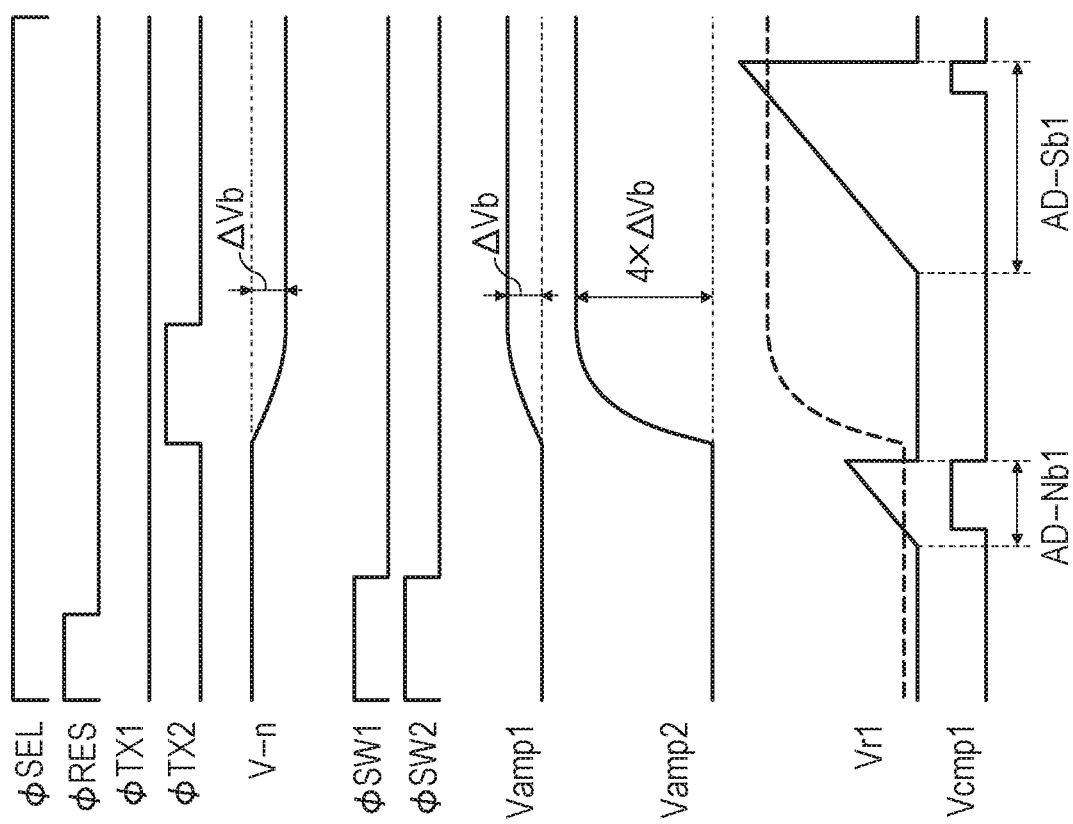
FIG. 5A illustrates a detail of an operation related to a pixel in one row of the imaging sensor.
Figure 5B:
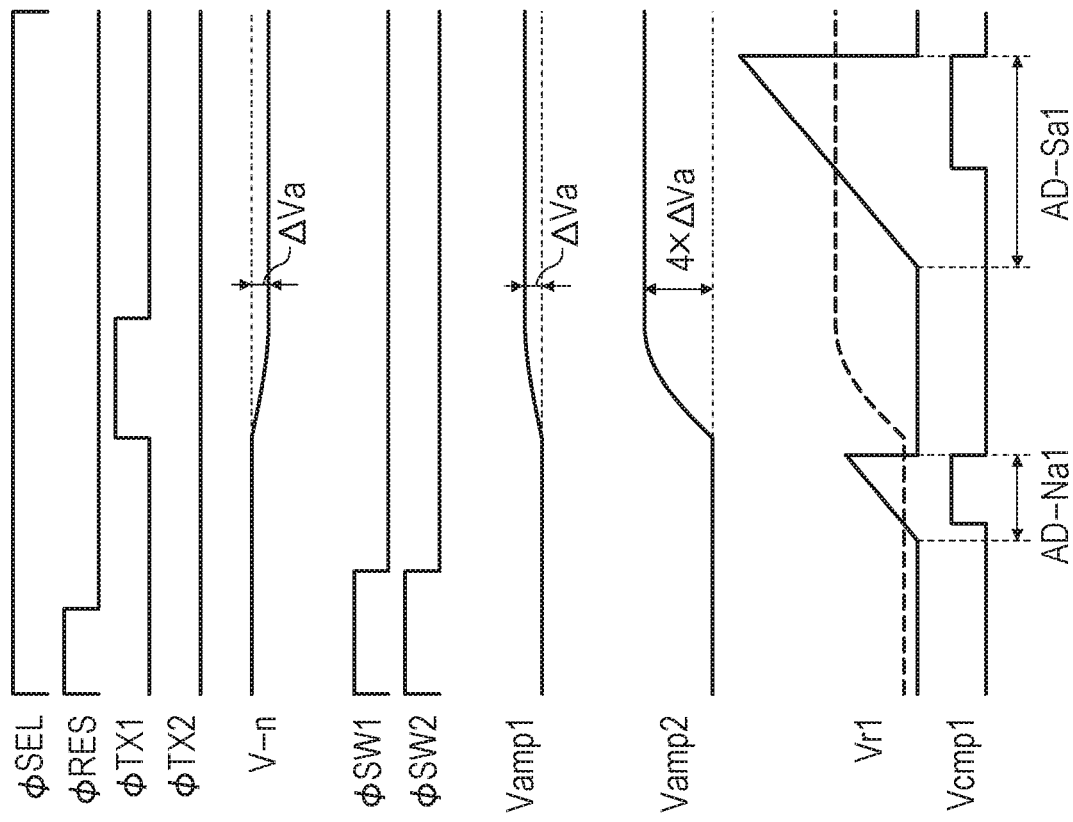
FIG. 5B illustrates the detail of the operation related to the pixel in one row of the imaging sensor.

FIGS. 5A and 5B are timing charts illustrating the operation of the pixel 11 in one row. FIG. 5A illustrates the operation during the period from the time t4 until the time t7. FIG. 5B illustrates the operation during a period from the time t10 until a time t11.

First, the period from the time t4 until the time t7 will be described. The vertical scanning circuit 20 sets the signal ϕSEL at the H level. As a result, the selection transistor MSEL turns on. In addition, the vertical scanning circuit 20 sets the signal ϕRES at the H level. As a result, a potential of the input node FD is reset. Subsequently, the vertical scanning circuit 20 sets the signal ϕRES at the L level. As a result, the resetting of the input node FD is cancelled. The amplification transistor MSF outputs a pixel noise signal (PN signal) corresponding to the potential of the input node FD in which the reset is cancelled to the vertical signal line V-n via the selection transistor MSEL.

In addition, the timing generation circuit 70 sets the signal ϕSW1 and the signal ϕSW2 at the H level while the signal ϕRES is at the H level. As a result, the charges of the capacitor element CIN1, the capacitor element CFB1, the capacitor element CIN2, and the capacitor element CFB2 are reset. After the signal ϕRES turns to the L level and the PN signal output to the vertical signal line V-n is settled, the timing generation circuit 70 sets the signal ϕSW1 and the signal ϕSW2 at the L level. As a result, the resetting of the capacitor element CIN1, the capacitor element CFB1, the capacitor element CIN2, and the capacitor element CFB2 is ended. Each of the capacitor element CIN1 and the capacitor element CIN2 clamps the PN signal output to the vertical signal line V-n.

The signal Vamp1 output by the inverting amplifier circuit AMP1 at this time is a signal at a noise level of the inverting amplifier circuit AMP1 (Voff1 signal). The signal Vamp2 of the inverting amplifier circuit AMP2 is a signal at a noise level of the inverting amplifier circuit AMP2 (Voff2 signal).

The ramp signal supply unit 33 starts the change in the potential over time of the ramp signal Vr. The AD conversion for the first time (hereinafter, which will be referred to as AD-Na1 conversion) is performed. In the AD-Na1 conversion, a comparison between the signal Vamp1 (Voff1 signal) and the ramp signal Vr1 by the comparison circuit CMP1 and a comparison between the signal Vamp2 (Voff2 signal) and the ramp signal Vr1 by the comparison circuit CMP2 are respectively performed. A signal level of the signal Vcmp1 output by the comparison circuit CMP1 changes from the L level to the H level at a timing when a magnitude relationship between the signal Vamp1 and the ramp signal Vr1 changes. The memory 40-n holds a count value of the counter 45 as a digital signal Na1 at the timing corresponding to the change in the signal level of the output signal Vcmp1. A signal level of the signal Vcmp2 output by the comparison circuit CMP2 changes from the L level to the H level at a timing when the magnitude relationship between the signal Vamp2 and the ramp signal Vr1 changes. The memory 40-n holds the count value of the counter 45 as a digital signal Na2 at the timing corresponding to the change in the signal level of the output signal Vcmp. In this manner, the memory 40-n holds the digital signal Na1 and the digital signal Na2. The digital signal Na1 is a digital signal corresponding to the Voff1 signal of the inverting amplifier circuit AMP1. In addition, the digital signal Na2 is a digital signal corresponding to the Voff2 signal of the inverting amplifier circuit AMP2.

After the AD-Na1 conversion is ended, the vertical scanning circuit 20 sets the signal ϕTX1 at the H level and then sets the signal ϕTX1 at the L level. As a result, the signal held by the signal holding unit MEM1 is transferred to the floating diffusion FD. With this configuration, the pixel signal corresponding to the first accumulation period Texpa (S1+PN signal) is output from the amplification transistor MSF to the vertical signal line V-n. As a result, a potential of the vertical signal line V-n fluctuates by ΔVa that is a difference between the PN signal and the S1+PN signal.

The S1+PN signal is a signal including the PN signal that is the pixel noise signal. Each of the capacitor element CIN1 and the capacitor element CIN2 clamps the PN signal. Therefore, a S1 signal obtained by subtracting the PN signal from the S1+PN signal is input to each of the inverting amplifier circuit AMP1 and the inverting amplifier circuit AMP2.

The inverting amplifier circuit AMP1 outputs a signal obtained by amplifying the S1 signal by the amplification factor of 1 time as the signal Vamp1. The signal Vamp1 includes the Voff1 signal. Herein, this signal is represented as an S1+Voff1 signal. The inverting amplifier circuit AMP2 outputs a signal obtained by amplifying the S1 signal by the amplification factor of 4 times as the signal Vamp2. This output signal includes the Voff2 signal. Herein, this signal is represented as a 4S1+Voff2 signal.

Since the potential change of the signal Vamp1 is a change from the Voff1 signal to the S1+Voff1 signal, as illustrated in FIG. 5A, the potential change corresponds to ΔVa. In addition, since the potential change of the signal Vamp2 is a change from the Voff2 signal to the 4S1+Voff2 signal, as illustrated in FIG. 5A, the potential change corresponds to 4×ΔVa.

The ramp signal supply unit 33 starts the change in the potential over time of the ramp signal Vr again. The AD conversion unit performs the AD conversion for the second time (hereinafter, which will be referred to as AD-Sa1 conversion). In the AD-Sa1 conversion, a comparison between the signal Vamp1 (S1+Voff1 signal) and the ramp signal Vr1 by the comparison circuit CMP1 and a comparison between the signal Vamp2 (4S1+Voff2 signal) and the ramp signal Vr1 by the comparison circuit CMP2 are respectively performed. The signal level of the signal Vcmp1 output by the comparison circuit CMP1 changes from the L level to the H level at the timing when the magnitude relationship between the signal Vamp1 and the ramp signal Vr1 changes. The memory 40-n holds the count value of the counter 45 as a digital signal Sa1 at the timing corresponding to the change in the signal level of the output signal Vcmp1. In addition, the signal level of the signal Vcmp2 output by the comparison circuit CMP2 changes from the L level to the H level at the timing when the magnitude relationship between the signal Vamp2 and the ramp signal Vr1 changes. The memory 40-n holds the count value of the counter 45 as a digital signal Sa2 at the timing corresponding to the change in the signal level of the output signal Vcmp2. In this manner, the memory 40-n holds the digital signal Sa1 and the digital signal Sa2. The digital signal Sa1 is a digital signal corresponding to the S1+Voff1 signal output by the inverting amplifier circuit AMP1. In addition, the digital signal Sa2 is a digital signal corresponding to the 4S1+Voff2 signal output by the inverting amplifier circuit AMP2.

When the AD-Sa1 conversion is ended, the horizontal scanning circuit 50 horizontally scans the memory 40-n in each column. As a result, each of the digital signals Na1, Na2, Sa1, and Ss2 is output from the memory 40-n in each column to the signal processing unit 60. The signal processing unit 60 obtains a digital signal Da1=Sa1−Na1 corresponding to the signal ΔVa and a digital signal Da2=Sa2−Na2 corresponding to the signal 4×ΔVa. Both of the digital signal Da1 and the digital signal Da2 are output to the outside of the imaging sensor.

Next, the period from the time t10 until the time t11 will be described. First, an operation of an AD-Nb1 conversion illustrated in FIG. 5B is the same the operation of the AD-Na1 conversion of FIG. 5A. The memory 40-n holds a digital signal Nb1 and a digital signal Nb2 on the basis of the AD-Nb1 conversion. The digital signal Nb1 is a digital signal corresponding to the Voff1 signal. In addition, the digital signal Nb2 is a digital signal corresponding to the Voff2 signal.

After the AD-Nb1 conversion is ended, the vertical scanning circuit 20 sets the signal φTX2 at the H level and then sets the signal φTX2 at the L level. As a result, the signal held by the signal holding unit MEM2 is transferred to the floating diffusion FD. With this configuration, the pixel signals corresponding to the second accumulation period Texpb (S2+PN signal) are output from the amplification transistor MSF to the vertical signal line V-n. As a result, the potential of the vertical signal line V-n fluctuates by ΔVb that is a difference between the PN signal and the S2+PN signal.

The S2+PN signal is a signal including the PN signal that is the pixel noise signal. Each of the capacitor element CIN1 and the capacitor element CIN2 clamps the PN signal. Therefore, an S2 signal obtained by subtracting the PN signal from the S2+PN signal is input to each of the inverting amplifier circuit AMP1 and the inverting amplifier circuit AMP2.

The inverting amplifier circuit AMP1 outputs a signal obtained by amplifying the S2 signal by the amplification factor of 1 time as the signal Vamp1. The signal Vamp1 includes the Voff1 signal. Herein, the signal is represented by the S2+Voff1 signal. The inverting amplifier circuit AMP2 outputs a signal obtained by amplifying the S2 signal by the amplification factor of 4 times as the signal Vamp2. This output signal includes the Voff2 signal. Herein, the signal is represented by the 4S2+Voff2 signal.

Since the potential change of the signal Vamp1 is a change from the Voff1 signal to the S2+Voff1 signal, as illustrated in FIG. 5B, the potential change corresponds to ΔVb. In addition, since the potential change of the signal Vamp2 is a change from the Voff2 signal to the 4S2+Voff2 signal, as illustrated in FIG. 5B, the potential change corresponds to 4×ΔVb.

The ramp signal supply unit 33 starts the change in the potential over time of the ramp signal Vr again. The AD conversion unit performs the AD conversion for the fourth time (hereinafter, which will be referred to as AD-Sb1 conversion). In the AD-Sb1 conversion, a comparison between the signal Vamp1 (S2+Voff1 signal) and the ramp signal Vr1 by the comparison circuit CMP1 and a comparison between the signal Vamp2 (4S2+Voff2 signal) and the ramp signal Vr1 by the comparison circuit CMP2 are respectively performed. The signal level of the signal Vcmp1 output by the comparison circuit CMP1 changes from the L level to the H level at the timing when the magnitude relationship between the signal Vamp1 and the ramp signal Vr1 changes. The memory 40-n holds the count value of the counter 45 as a digital signal Sb1 at the timing corresponding to the change in the signal level of the output signal Vcmp1. In addition, the signal level of the signal Vcmp2 output by the comparison circuit CMP2 changes from the L level to the H level at the timing when the magnitude relationship between the signal Vamp2 and the ramp signal Vr1 changes. The memory 40-n holds the count value of the counter 45 as a digital signal Sb2 at the timing corresponding to the change in the signal level of the output signal Vcmp2. In this manner, the memory 40-n holds the digital signal Sb1 and the digital signal Sb2. The digital signal Sb1 is a digital signal corresponding to the S2+Voff1 signal output by the inverting amplifier circuit AMP1. In addition, the digital signal Sb2 is a digital signal corresponding to the 4S2+Voff2 signal output by the inverting amplifier circuit AMP2.

When the AD-Sb1 conversion is ended, the horizontal scanning circuit 50 performs horizontal scanning of the memory 40-n in each column. As a result, each of the digital signals Nb1, Nb2, Sb1, and Sb2 is output from the memory 40-n in each column to the signal processing unit 60. The signal processing unit 60 obtains a digital signal Db1=Sb1−Nb1 corresponding to the signal ΔVb and a digital signal Db2=Sb2−Nb2 corresponding to the signal 4×ΔVa. Both the digital signal Da1 and the digital signal Da2 are output to the outside of the imaging sensor.

In an imaging system including the imaging sensor 100 (imaging system according to an eighth exemplary embodiment which will be described below), digital gain processing in which an accumulation time ratio and a gain ratio are taken into account is performed on the thus obtained digital signals Da1, Da2, Db1, and Db2, and signal processing such as noise reduction is further performed to generate an image.

Advantages of the Present Exemplary Embodiment

Descriptions will be given of advantages of the present exemplary embodiment.

FIGS. 6A and 6B are explanatory diagrams for describing the advantages according to the present exemplary embodiment. FIG. 6A illustrates dynamic ranges of the digital signals Da1, Da2, Db1, and Db2 when a ratio of the first accumulation period Texpa to the second accumulation period Texpb is 1:1000 according to the present exemplary embodiment. FIG. 6B illustrates ratios of noise to an input optical signal, that is, N/S, of the digital signals Da1, Da2, Db1, and Db2 under the same condition. The vertical axis in FIG. 6A represents a Log scale of the light quantity. A numeric value assigned to the vertical axis is a value obtained by converting the dynamic range of the digital signal into an electron number. In the present specification, the light quantity is represented by this electron number conversion value.

First, in the digital signals Db1 and Db2 obtained by the above-described operation, dark random noise included in the digital signal Db2 processed by the amplification factor of 4 times is smaller than dark random noise included in the digital signal Db1. For this reason, a lower limit of the dynamic range of the digital signal Db2 is lower than a lower limit of the dynamic range of the digital signal Db1. To facilitate understanding of the following explanations, the dynamic range of the digital signal Db1 is set as 10 e to 10,000 e, and the lower limit of the dynamic range of the digital signal Db2 is set as 5 e.

An upper limit of the dynamic range of the digital signal Db2 is ¼ of an upper limit of the dynamic range of the digital signal Db1 since the processing is performed by the amplification factor of 4 times. Therefore, the upper limit of the dynamic range of the digital signal Db2 is set as 2,500 e.

Subsequently, a lower limit of the dynamic range of the digital signal Da1 is set as 10 e×1,000=10,000 e since a ratio of the lengths of the first accumulation period Texpa and the second accumulation period Texpb is 1:1000, an upper limit of the dynamic range of the digital signal Da1 is also 10,000 e×1,000=10,000,000 e. Similarly as in the digital signal Da1, a lower limit of the digital signal Da2 is 5,000 e, and an upper limit of the digital signal Da2 is 2,5000,000 e.

When one image is obtained by appropriately using the digital signals Da1, Da2, Db1, and Db2, it is possible to obtain the dynamic range of 5 e to 10,000,000 e.

Selection of the digital signals for the image generation will be further described. At this time, a further focus is put on N/S illustrated in FIG. 6B. In FIG. 6B, the horizontal axis represents the light quantity similarly as in the vertical axis of FIG. 6A. On the other hand, the vertical axis represents N/S obtained from the light quantity, the dark random noise, and shot noise. In the case of an imaging scene with the light quantity of 5 e to 2,500 e, N/S of the digital signal Db2 is lower than N/S of the digital signal Db1. Therefore, to reduce the dark random noise, in a case where the light quantity is 2,500 e or lower, the digital signal Db2 is more preferably used than the digital signal Db1.

In the imaging scene with the light quantity of 2,500 e to 10,000 e, the image generation using the digital signal Db1 is preferably performed. In the imaging scene with the light quantity of 10,000 e to 2,500,000 e, the image generation using the digital signal Da2 is preferably performed. In the imaging scene with the light quantity of 2,500,000 e to 10,000,000 e, the image generation using the digital signal Da1 is preferably performed. It should be noted that, although the dynamic range of the light quantity of 5 e to 10,000,000 e can be obtained without using the digital signal Da2, in a case where the digital signal Da2 is used, it is also possible to attain an advantage for alleviating a steep noise difference between the signals generated in different accumulation times.

According to the present exemplary embodiment, furthermore, it is also possible to expand the dynamic range on the upper limit side by adjusting the lengths of the first accumulation period Texpa and the second accumulation period Texpb.

FIGS. 7A and 7B illustrate the input dynamic ranges of the digital signals Da1, Da2, Db1, and Db2 (FIG. 7A) and N/S (FIG. 7B) when the ratio of the first accumulation period Texpa to the second accumulation period Texpb is 1:2000. In FIG. 6A, the lower limit side of the dynamic range of the digital signal Da2 and the upper limit side of the dynamic range of the digital signal Db1 are overlapped with each other in 5,000 e to 10,000 e. When the ratio of the first accumulation period Texpa to the second accumulation period Texpb is 1:2000, the lower limits and the upper limits of the dynamic ranges of the digital signal Da1 and the digital signal Da2 are respectively doubled. As a result, as illustrated in FIG. 7A, the overlap of the lower limit of the input dynamic range of the digital signal Da2 with the upper limit side of the dynamic range of the digital signal Db1 disappears. The dynamic range of the digital signal Da1 is set as 20,000 e to 20,000,000 e, and the dynamic range of the digital signal Da2 is set as 10,000 e to 5,000,000 e. Therefore, when the lengths of the first accumulation period Texpa and the second accumulation period Texpb are adjusted while the ratio of the first accumulation period Texpa to the second accumulation period Texpb is 1:1000 to 2000, it is possible to reduce the overlapping amount of the lower limit side of the dynamic range of the digital signal Da2 and the upper limit side of the dynamic range of the digital signal Db1 and further expand the dynamic range on the upper limit side too.

It should be noted however that, when the input dynamic range expansion on the upper limit side is performed, as illustrated in FIG. 7B, N/S of the digital signal Da2 in the vicinity of 10,000 e is increased. For this reason, the advantage for alleviating the steep noise difference between the signals generated in the different accumulation times is diminished. Therefore, it is sufficient when the lengths of the first accumulation period Texpa and the second accumulation period Texpb are set such that the alleviation of the steep noise difference between the signals generated in the different accumulation times and the expansion of the dynamic range can be optimized in accordance with the imaging scene.

FIG. 8 is a flow chart illustrating a sequence of the imaging system (corresponding to the imaging system according to the eighth exemplary embodiment which will be described below) when a digital signal used for obtaining an image is selected.

In step S02, it is determined whether to expand both of the upper and lower limits of the dynamic range. When "Yes" is selected, the processing proceeds to step S05. In step S05, the imaging system selects the signal to be used from among the digital signals Da1, Da2, Db1, and Db2 in accordance with the light quantity and obtains one image.

On the other hand, in step S02, when "No" is selected, the processing proceeds to step S03.

In step S03, it is determined whether to expand one of the upper and lower limits of the dynamic range. When the "upper limit" is selected, the processing proceeds to step S06. In step S06, the imaging system selects the signal to be used from among the digital signals Da1, Da2, and Db2 in accordance with the light quantity and obtains one image.

On the other hand, in step S03, when the "lower limit" is selected, the processing proceeds to step S04.

In step S04, it is determined whether to execute the noise reduction between signals generated during the first and second accumulation periods. When "Yes" is selected, the processing proceeds to step S07. In step S07, the imaging system selects the signal to be used from among the digital signals Da2, Db1, and Db2 in accordance with the light quantity and obtains one image.

In step S04, when "No" is selected, the processing proceeds to step S08. In step S08, the imaging system generates the image by using at least the digital signal Db2.

As described above, according to the present exemplary embodiment, the advantage is attained that each of the lower limit and the upper limit of the dynamic range can be expanded. In addition, the imaging sensor according to the present exemplary embodiment can obtain the advantage that the steep noise difference between the signals generated in the different accumulation times is alleviated.

It should be noted that the specific numeric values are used for the amplification factors and the accumulation periods according to the present exemplary embodiment, but the advantage attained according to the exemplary embodiment is not limited by these values, and the values can be appropriately changed.

In addition, according to the present exemplary embodiment, the signal corresponding to the first accumulation period Texpa and the signal corresponding to the second accumulation period Texpb are respectively multiplied by the different amplification factors. The exemplary embodiment is not limited to this example, and one of the signal corresponding to the first accumulation period Texpa and the signal corresponding to the second accumulation period Texpb may be multiplied by different amplification factors. As a result, it is possible to obtain a plurality of signals by amplifying one of the signal corresponding to the first accumulation period Texpa and the signal corresponding to the second accumulation period Texpb by the different amplification factors. When the image is generated by using the plurality of signals, it is possible to expand the dynamic range.

It should be noted that, according to the present exemplary embodiment, it is sufficient when synchronicity in each of the electronic shutter operation and the global transfer operation is set to be at a practically acceptable level. When all of unit cells are driven completely at the same time, large load is applied to a driving driver. To alleviate this load, a configuration may be adopted in which a small time difference between the plurality of unit cells may be provided in each of the electronic shutter operation and the global transfer operation. In the above-described case too, each of the electronic shutter operation and the global transfer operation falls within a category of a relationship of being substantially "at the same time".

Second Exemplary Embodiment

A second exemplary embodiment will be described. Hereinafter, different aspects from the first exemplary embodiment will be mainly described.

Figure 9:
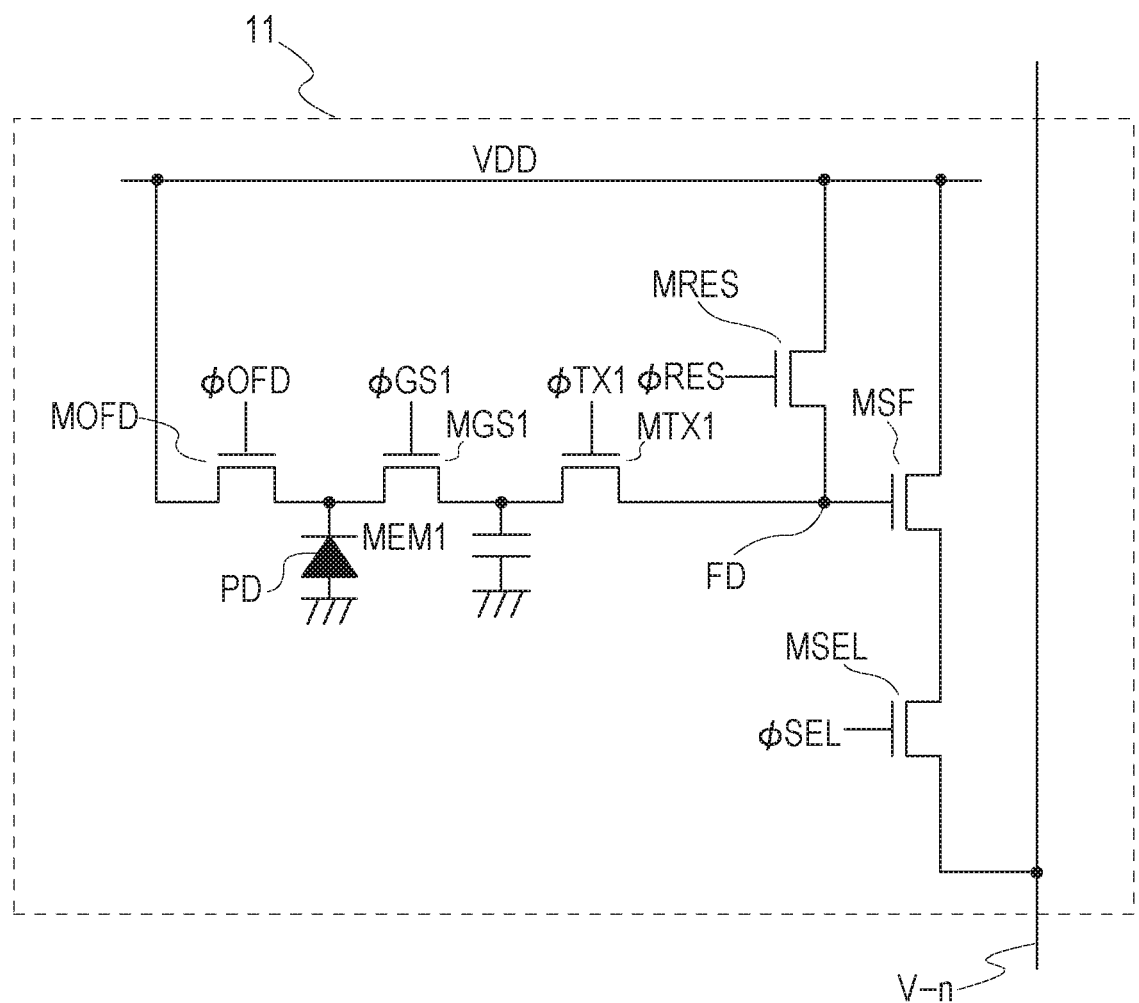
FIG. 9 illustrates the configuration of the pixel.

The present exemplary embodiment is different from the first exemplary embodiment in a configuration of the pixel. FIG. 9 illustrates a configuration of the pixel according to the present exemplary embodiment. A different aspect from the first exemplary embodiment resides in that the signal holding unit MEM2, the transfer transistor MGS2, and the transfer transistor MTX2, which are included in the pixel 11 according to the first exemplary embodiment, are not included in the pixel 11 according the present exemplary embodiment. The other configuration of the pixel 11 and the configuration of the imaging sensor are the same as those according to the first exemplary embodiment.

FIG. 10 is an operation timing chart in one frame according to the present exemplary embodiment. According to the present exemplary embodiment, the transfer of the signal accumulated by the photoelectric conversion unit PD is performed by using a transfer transistor GS1. For this reason, the end of the second accumulation period Texpb is also controlled by the signal φGS1 similarly as in the end of the first accumulation period Texpa. Therefore, the signal φGS1 is also set at the H level during a period from the time t8 until the time t9, and the signal based on the second accumulation period Texpb is transferred to the signal holding unit MEM1.

Subsequently, a readout operation in one row will be described.

FIGS. 11A and 11B are readout operation timing charts in one row. FIG. 11A is an operation timing chart during the period from the time t4 until the time t7 illustrated in FIG. 10. FIG. 11B is an operation timing chart during a period from the time t10 until a time t11 illustrated in FIG. 10. According to the present exemplary embodiment, similarly as in the operation during the period from the time t4 until the time t7, while the transfer transistor is controlled by the signal φTX1, the pixel signal based on the second accumulation period Texpb is read out from the signal holding unit MEM1 during the period from the time t10 until the time t11 too.

In the configuration according to the present exemplary embodiment too, the signals are output which are obtained by amplifying each of the signal corresponding to the first accumulation period Texpa and the signal corresponding to the second accumulation period Texpb by using the plurality of amplification factors by the amplification unit 31-$n$. As a result, the digital signals Da1, Da2, Db1, and Db2 can be obtained. It is possible to attain the same advantage as the first exemplary embodiment.

Third Exemplary Embodiment

A third exemplary embodiment will be described. Hereinafter, different aspects from the first exemplary embodiment will be mainly described.

According to the first exemplary embodiment, the operation for amplifying the signal output from the pixel 11 to the vertical signal line V-n is performed by the amplification unit 31 of the readout unit 30. According to the present exemplary embodiment, the operation for amplifying the signal output from the pixel 11 to the vertical signal line V-n is performed by the AD conversion unit including the ramp signal supply unit 33, the comparison unit 32, the counter 45, and the memory unit 40.

Figure 12:
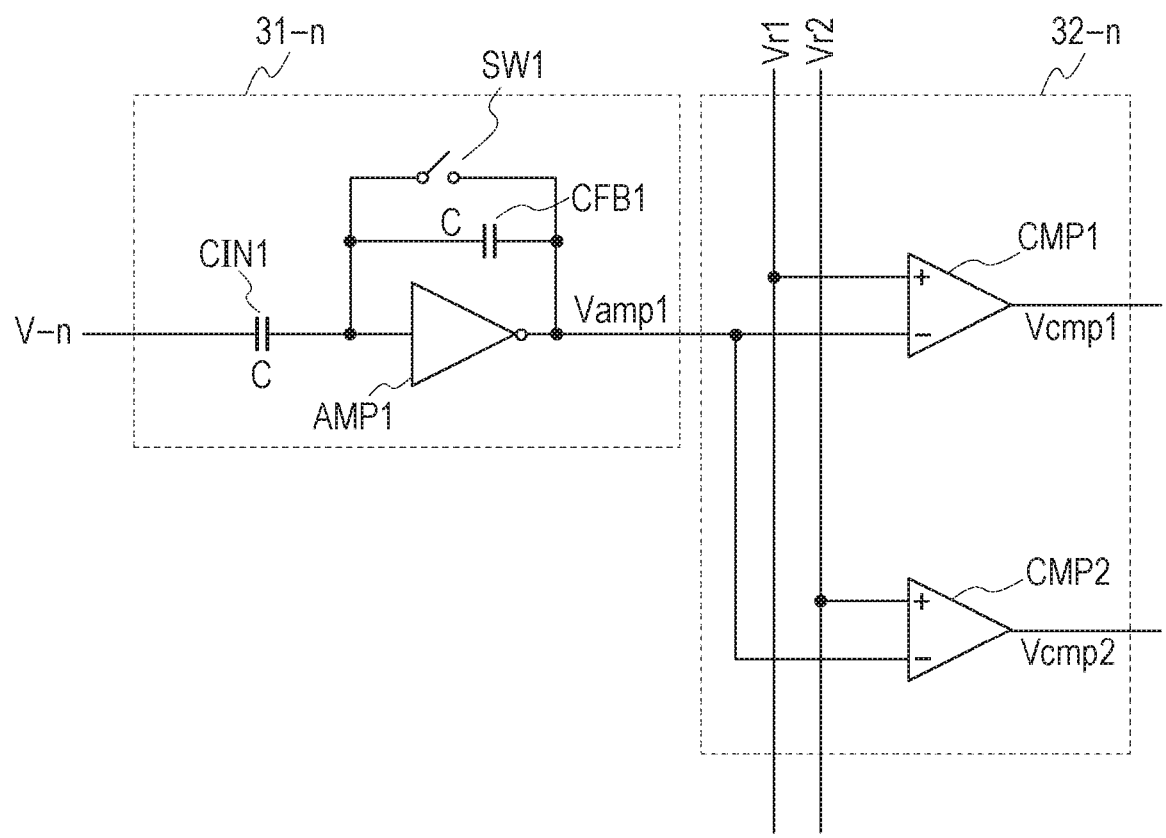
FIG. 12 illustrates the configurations of the amplification unit and the comparison unit.

According to the present exemplary embodiment, the configuration of the readout unit 30 is different from that of the first exemplary embodiment. FIG. 12 illustrates configurations of the amplification unit 31-n and the comparison unit 32-n arranged in each column of the readout unit 30 according to the present exemplary embodiment.

A different aspect from the first exemplary embodiment resides in that the inverting amplifier circuit AMP2, the capacitor elements CIN2 and CFB2, and the switch SW2 are not included in the amplification unit 31-n. The amplification unit 31-n outputs a signal obtained by amplifying the pixel signal input from the vertical signal line V-n by the amplification factor of 1 time as the signal Vamp1. In addition, a different aspect from the first exemplary embodiment resides in that the signal Vamp1 is input to both the comparison circuit CMP1 and the comparison circuit CMP2 in the comparison unit 32-n. The comparison circuit CMP1 compares the ramp signal Vr1 with the signal Vamp1. In addition, the comparison circuit CMP2 compares the ramp signal Vr2 with the signal Vamp1.

The ramp signal supply unit 33 outputs the ramp signal Vr1 and the ramp signal Vr2. A changing quantity (gradient) of the potential over time of the ramp signal Vr2 is ¼ of a changing quantity (gradient) of the potential over time of the ramp signal Vr1.

FIGS. 13A and 13B are readout operation timing charts in one row according to the present exemplary embodiment. FIG. 13A is an operation timing chart during the period from the time t4 until the time t7 illustrated in FIG. 4. FIG. 13B is an operation timing chart during the period from the time t10 until the time t11 illustrated in FIG. 4. The ramp signal Vr2 changes by the gradient that is ¼ of the gradient of the ramp signal Vr1 in the AD-Na1 conversion, the AD-Sa1 conversion, the AD-Sb1 conversion, and AD-Sb2 conversion. As a result, according to the present exemplary embodiment, an AD conversion gain of the comparison circuit CMP2 is set to be 4 times as high as an AD conversion gain of the comparison circuit CMP1. According to the present exemplary embodiment, the AD conversion is performed on each of the signal corresponding to the first accumulation period Texpa and the signal corresponding to the second accumulation period Texpb plural times by varying the AD conversion gain. As a result, it is possible to obtain the signals obtained by respectively amplifying the signal corresponding to the first accumulation period Texpa and the signal corresponding to the second accumulation period Texpb by the different amplification factors. According to the present exemplary embodiment too, the digital signals Da1, Da2, Db1, and Db2 can be obtained.

Thus, with the configuration according to the present exemplary embodiment too, it is possible to attain the same advantage as the first exemplary embodiment.

Fourth Exemplary Embodiment

Subsequently, a fourth exemplary embodiment will be described. Hereinafter, different aspects from the first exemplary embodiment will be mainly described.

According to the present exemplary embodiment, the configuration of the readout unit 30 is different from that of the first exemplary embodiment.

Figure 14:
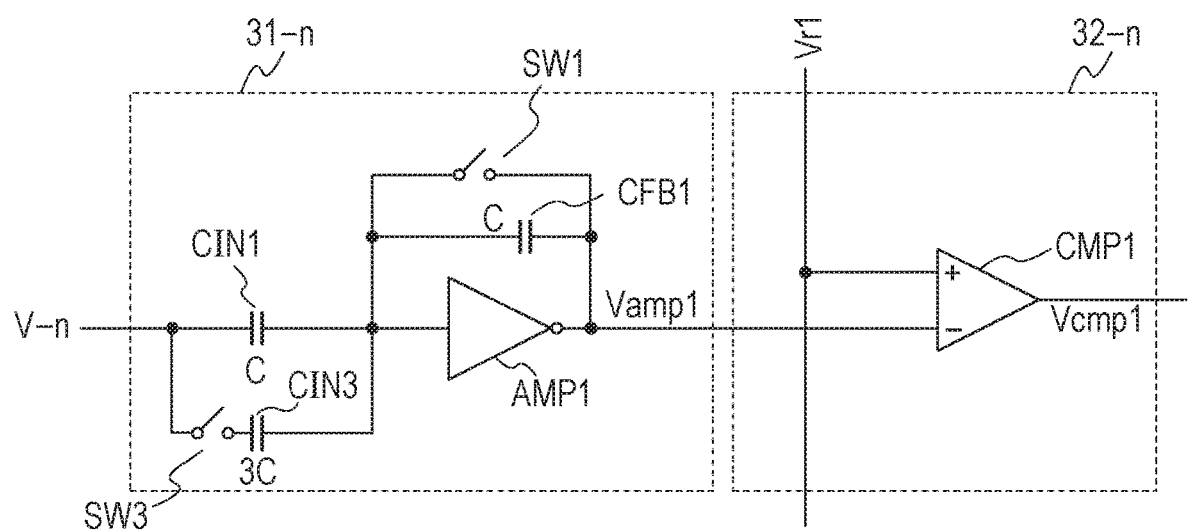
FIG. 14 illustrates the configurations of the amplification unit and the comparison unit.

FIG. 14 illustrates configurations of the amplification unit 31-n and the comparison unit 32-n in each column of the readout unit 30 according to the present exemplary embodiment.

A difference from the first exemplary embodiment in the amplification unit 31-n resides in the following two aspects.

First, the inverting amplifier circuit AMP2, the capacitor element CIN2, the capacitor element CFB2, and the switch SW2 are not included. Second, the amplification unit 31-n includes a capacitor element CIN3 and a switch SW3. The capacitor element CIN3 is connected to the switch SW3 in series. The capacitor element CIN3 and the switch SW3 connected in series are connected in parallel with the capacitor element CIN1. When the signal φSW3 is set at the H level, the switch SW3 turns on, and the capacitor element CIN3 functions as an input capacitor element of the inverting amplifier circuit AMP1 together with the capacitor element CIN1. When both the signal φSW1 and the signal φSW3 are set at the H level, the switches SW1 and SW3 turn on. As a result, charges of the capacitor element CIN3 are reset together with the charges of the capacitor element CFB1 and the capacitor element CIN1.

The amplification factor of the amplification unit 31-n in a case where the signal φSW3 is at the L level becomes a ratio of the capacitance values of the capacitor element CIN1 and the capacitor element CFB1. On the other hand, the amplification factor of the amplification unit 31-n in a case where the signal φSW3 is at the H level becomes a ratio of a sum of the capacitance values of the capacitor element CIN1 and the capacitor element CIN3 and the capacitance value of the capacitor element CFB1. Herein, the capacitance values of the capacitor element CIN1, the capacitor element CIN3, and the capacitor element CFB1 are respectively C, 3C, and C, and the pixel signal is amplified by 1 time when the signal φSW3 is at the L level and amplified by 4 times when the signal φSW3 is at the H level to be output as the signal Vamp1.

The comparison unit 32-n includes the comparison circuit CMP1. Similarly as in the first exemplary embodiment, the comparison circuit CMP1 compares the signal Vamp1 of the inverting amplifier circuit AMP1 with the ramp signal Vr1 output from the ramp signal supply unit 33.

Figure 15A:
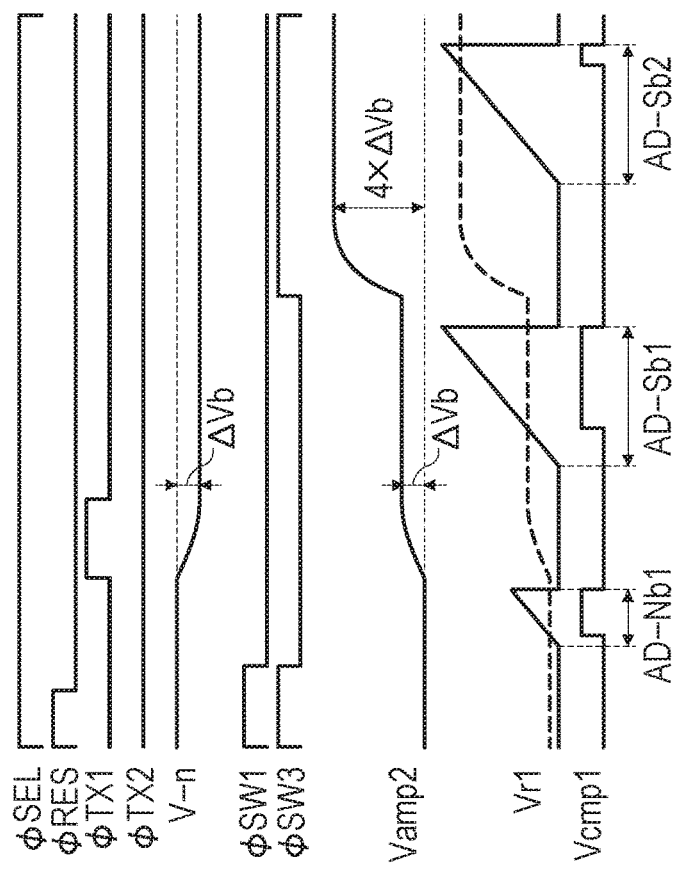
FIG. 15A illustrates the detail of the operation related to the pixel in one row of the imaging sensor.
Figure 15B:
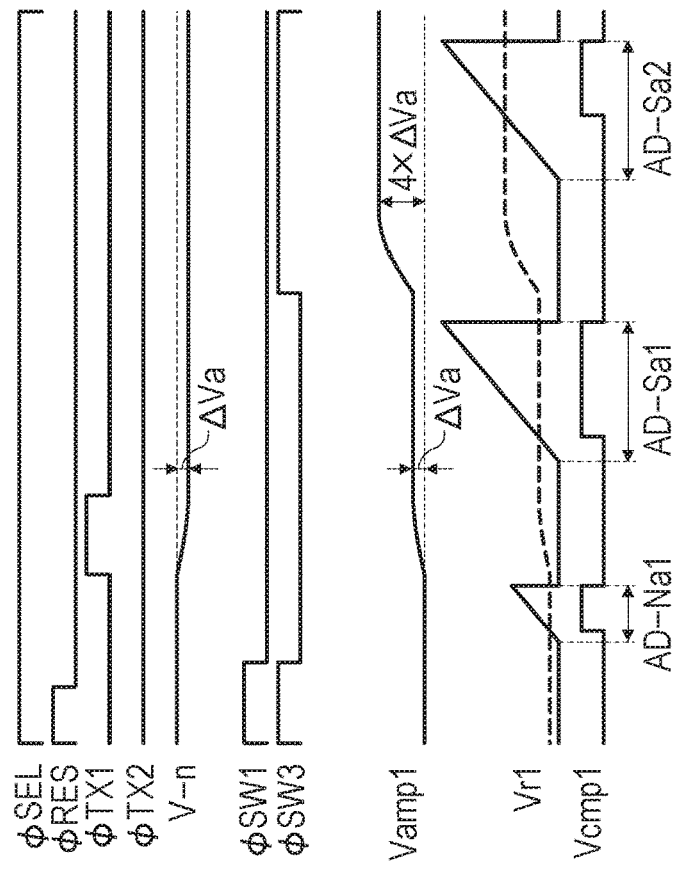
FIG. 15B illustrates the detail of the operation related to the pixel in one row of the imaging sensor.

FIGS. 15A and 15B are readout operation timing charts in one row according to the present exemplary embodiment. FIG. 15A is an operation timing chart during the period from the time t4 until the time t7 illustrated in FIG. 4. FIG. 15B is an operation timing chart during the period from the time t10 until the time t11 illustrated in FIG. 4.

A different aspect from the third exemplary embodiment during the period from the time t4 until the time t7 will be described with reference to FIG. 15A.

The timing generation circuit 70 sets the signal φSW3 at the H level while the signal φSW1 is at the H level. As a result, the charges of the capacitor element CIN3 are reset together with the charges of the capacitor element CFB1 and the capacitor element CIN1. After the vertical scanning circuit 20 sets a signal φRES3 at the L level and the potential of the vertical signal line V-n is settled, the timing generation circuit 70 sets both the signal φSW3 and the signal φSW1 at the L level. As a result, the amplification factor of the amplification unit 31-n becomes 1 time. In a state of the amplification factor of 1 time, similarly as in the first exemplary embodiment, the AD-Na1 conversion and the AD-Sa1 conversion are performed. As a result, the memory 40-n holds the digital signals Na1 and Sa1. When the AD-Sa1 conversion is ended, the digital signals Na1 and Sa1 are transmitted from the memory 40-n in each column to the signal processing unit 60 as a result of the horizontal scanning by the horizontal scanning circuit 50. The signal processing unit 60 calculates the digital signal Da1=Sa1−Na1 equivalent to the signal ΔVa to be output to the outside of the imaging sensor.

Subsequently, after the AD-Sa1 conversion is ended, the timing generation circuit 70 sets the signal φSW3 at the H level. As a result, the amplification factor of the amplification unit 31-$n$ becomes 4 times. As a result, with regard to the signal Vamp1 of the inverting amplifier circuit AMP1, the signal changed by 4×ΔVa with respect to the reset level is output. After the signal Vamp1 is settled, the ramp signal supply unit 33 starts the change in the potential over time of the ramp signal Vr1. As a result, the AD conversion unit performs the AD conversion for the third time (hereinafter, which will be referred to as AD-Sa2 conversion). In the AD-Sa2 conversion, the signal Vamp1 is compared with the ramp signal Vr1 by the comparison circuit CMP1. Similarly as in the AD-Sa1 conversion, the memory 40-$n$ holds the digital signal Sa2. When the AD-Sa2 conversion is ended, the digital signal Sa2 is transmitted from the memory 40-$n$ in each column to the signal processing unit 60 as a result of the horizontal scanning by the horizontal scanning circuit 50. The signal processing unit 60 calculates the digital signal Da2=Sa2−Na1 equivalent to the signal 4×ΔVa to be output to the outside of the imaging sensor.

In addition, the operation of FIG. 15B is the same as the operation of FIG. 15A except that the signal subjected to the AD conversion is set as the signal corresponding to the second accumulation period Texpb. The signal processing unit 60 calculates the digital signal Db1=Sb1−Nb1 equivalent to the signal ΔVb and the digital signal Db2=Sb2−Nb1 equivalent to the signal 4×ΔVb to be output to the outside of the imaging sensor.

When the digital signals Da1, Da2, Db1, and Db2 obtained from the above-described operation are used, it is also possible to attain the same advantage as the first exemplary embodiment.

Fifth Exemplary Embodiment

A fifth exemplary embodiment will be described. Hereinafter, only a different aspect from the third exemplary embodiment will be described. According to the third exemplary embodiment, the plurality of ramp signals having the different gradients are output to the comparison unit 32-$n$ in parallel. According to the present exemplary embodiment, the plurality of ramp signals having the different gradients are output to the comparison unit 32-$n$ in series.

Figure 16:
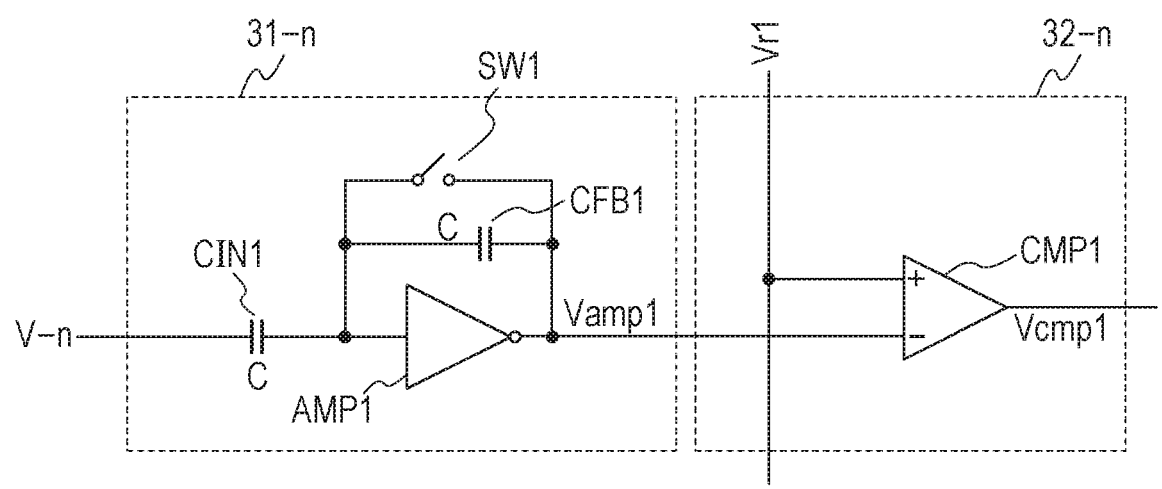
FIG. 16 illustrates the configurations of the amplification unit and the comparison unit.

The present exemplary embodiment is different from the third exemplary embodiment in the configuration of the comparison unit 32-$n$. FIG. 16 illustrates the configurations of the amplification unit 31-$n$ and the comparison unit 32-$n$ of the readout unit 30 according to the present exemplary embodiment.

A difference from the third exemplary embodiment in the comparison unit 32-$n$ resides in that the comparison circuit CMP2 is not included.

Figure 17A:
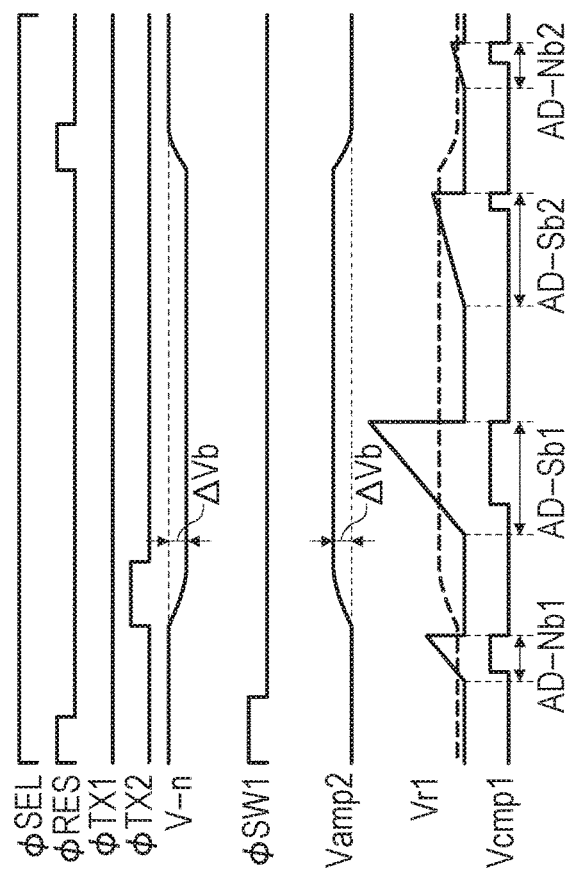
FIG. 17A illustrates the detail of the operation related to the pixel in one row of the imaging sensor.
Figure 17B:
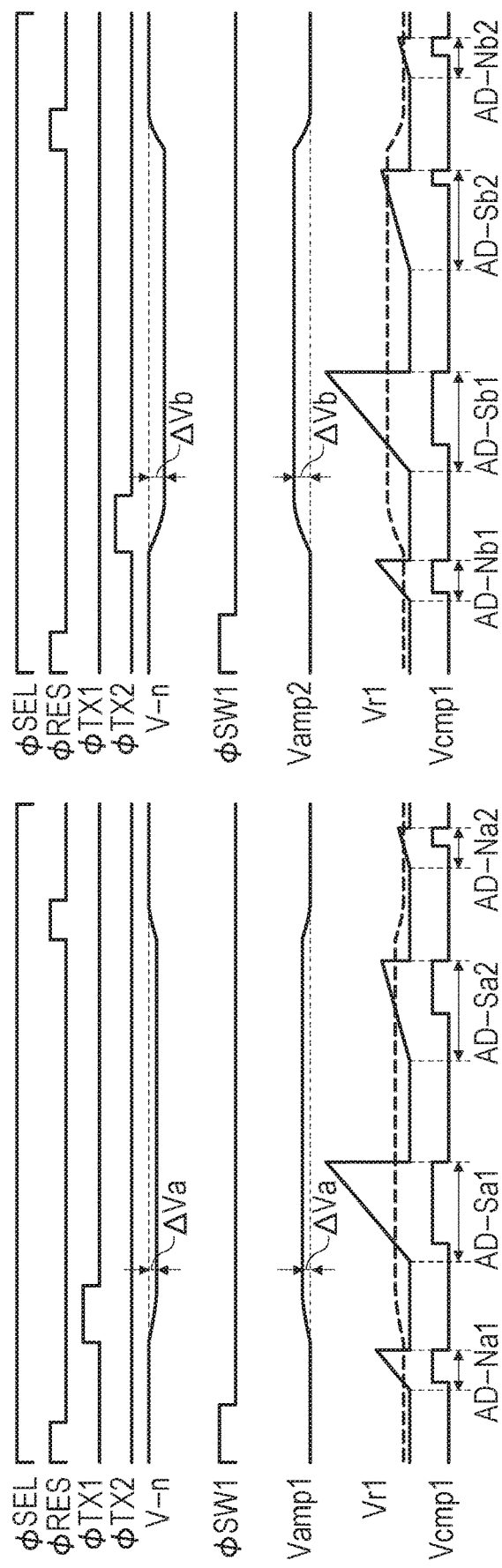
FIG. 17B illustrates the detail of the operation related to the pixel in one row of the imaging sensor.

FIGS. 17A and 17B are readout operation timing charts in one row according to the present exemplary embodiment. FIG. 17A is an operation timing chart during the period from the time t4 until the time t7 illustrated in FIG. 4. FIG. 17B is an operation timing chart during the period from the time t10 until the time t11 illustrated in FIG. 4.

The operation during the period from the time t4 until the time t7 will be described with reference to FIG. 17A.

Similarly as in the first exemplary embodiment, the AD-Na1 conversion and the AD-Sa1 conversion are performed. As a result, the digital signal Da1=Sa1−Na1 equivalent to the signal ΔVa is output to the outside of the imaging sensor.

When the AD-Sa1 conversion is ended, the ramp signal supply unit 33 starts the change in the potential over time of the ramp signal Vr1 again. As a result, the AD conversion unit performs the AD conversion for the third time (hereinafter, which will be referred to as AD-Sa2 conversion). It should be noted however that the gradient of the ramp signal Vr1 in the AD-Sa2 conversion is ¼ of the gradient of the ramp signal Vr in the AD-Na1 conversion and the AD-Sa1 conversion. Therefore, in the AD-Sa2 conversion, the AD conversion to which the amplification factor of 4 times is applied by the gradient of the ramp signal Vr is performed. The memory 40-$n$ holds this AD conversion result of the AD-Sa2 conversion as the digital signal Sa2.

After the AD-Sa2 conversion, the vertical scanning circuit 20 sets the signal φRES at the H level. As a result, the potential of the input node FD in the selected row is reset again. Along with this, a signal (PN2 signal) based on the resetting of the input node FD is output to the vertical signal line V-n. Thereafter, the ramp signal supply unit 33 starts the change in the potential over time of the ramp signal Vr. As a result, the AD conversion unit performs the AD conversion for the fourth time (hereinafter, which will be referred to as AD-Na2 conversion). The memory 40-$n$ holds the AD conversion result of the AD-Na2 conversion as the digital signal Na2. When the AD-Na2 conversion is ended, the digital signal Sa2 and the digital signal Na2 are transmitted to the signal processing unit 60. The signal processing unit 60 calculates the digital signal Da2=Sa2−Na2 equivalent to the signal 4×ΔVa to be output to the outside of the imaging sensor.

In addition, the operation of FIG. 17B is the same as the operation of FIG. 17A except that the signal subjected to the AD conversion is set as the signal corresponding to the second accumulation period Texpb. The signal processing unit 60 obtains the digital signal Db1=Sb1−Nb1 equivalent to the signal ΔVb and the digital signal Db2=Sb2−Nb1 equivalent to the signal 4×ΔVb and outputs the respective digital signals Db1 and Db2 to the outside of the imaging sensor.

When the digital signals Da1, Da2, Db1, and Db2 obtained from the above-described operation are used, it is also possible to attain the same advantage as the first exemplary embodiment.

It should be noted that, according to the present exemplary embodiment, the AD conversion unit performs the AD-Na1 conversion, the AD-Sa1 conversion, the AD-Sa2 conversion, and the AD-Na2 conversion in the stated order. In this case, it is possible to adopt a configuration in which the ramp signal supply unit 33 performs the processing for changing the gradient of the ramp signal Vr once between the AD-Sa1 conversion and the AD-Sa2 conversion.

On the other hand, in the case of the order of the AD conversions according to the present exemplary embodiment, the resetting of the input node FD is performed between the AD-Sa2 conversion and the AD-Na conversion. For this reason, correlativity of noise components of the digital signal Na2 and the digital signal Sa2 is decreased. In a case where an emphasis is put on the correlativity of the noise components of the digital signal Na2 and the digital signal Sa2, the order of the AD conversions is preferably set as the AD-Na1 conversion, the AD-Na2 conversion, the AD-Sa1 conversion, and the AD-Sa2 conversion. It should be noted that the order of the AD-Na1 conversion and the AD-Na2 conversion may be swapped in this case too. In addition, the order of the AD-Sa1 conversion and the AD-Sa2 conversion may be swapped.

Sixth Exemplary Embodiment

A sixth exemplary embodiment will be described. Hereinafter, a different aspect from the fourth exemplary embodiment will be mainly described.

The present exemplary embodiment is different from the fourth exemplary embodiment in the configuration of the amplification unit 31-n. The present exemplary embodiment is different from the fourth exemplary embodiment in that the signal Vamp1 output by the amplification unit 31-n is compared with a threshold, and the amplification factor of the amplification unit 31-n is changed on the basis of a result of the comparison.

Figure 18:
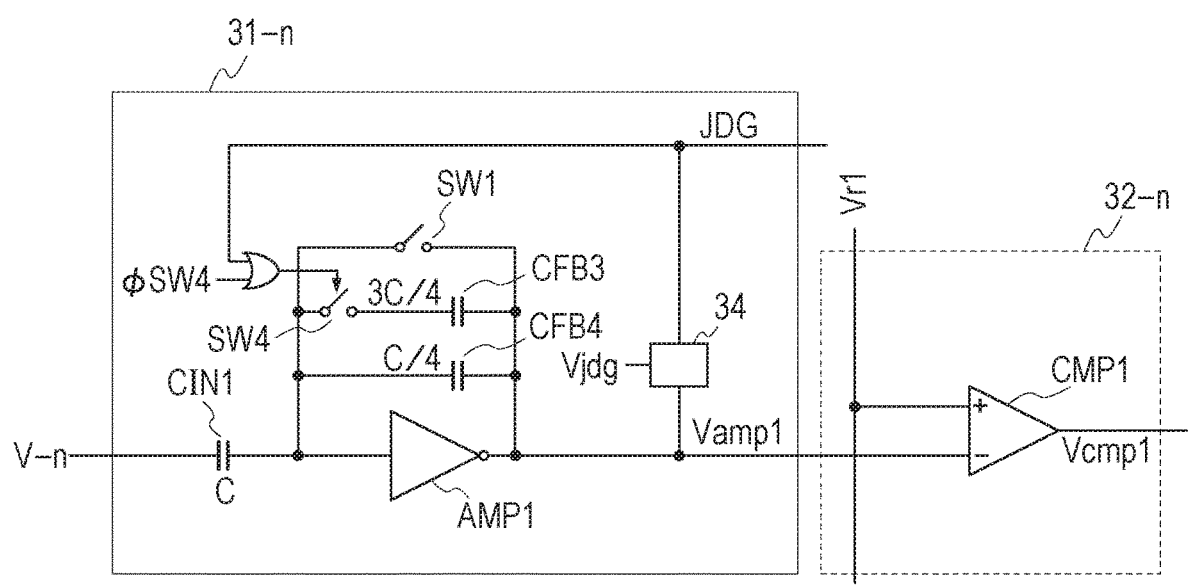
FIG. 18 illustrates the configurations of the amplification unit and the comparison unit.

FIG. 18 illustrates the circuit in each column of the readout unit 30 according to the exemplary embodiment, that is, configurations of the amplification unit 31-n and the comparison unit 32-n.

The amplification unit 31-n according to the sixth exemplary embodiment is different from that of the fourth exemplary embodiment in the following three aspects. First, a decision circuit 34 is included. Second, the input capacitor element is constituted by only the capacitor element CIN1. Third, the amplification unit 31-n includes a capacitor element CFB4, and a capacitor element CFB3 and a switch SW4 connected in series as the feedback capacitor element.

The decision circuit 34 decides whether an amplitude of a signal level of the signal Vamp1 of the inverting amplifier circuit AMP1 is lower or higher than a previously set threshold Vjdg. Then, the decision circuit 34 outputs a comparison result signal JDG indicating a result of the decision. In a case where it is decided that the amplitude of the signal Vamp1 is lower than the threshold Vjdg, the decision circuit 34 sets the comparison result signal JDG at the L level. On the other hand, in a case where it is decided that the amplitude of the signal Vamp1 is higher than the threshold Vjdg, the comparison result signal JDG is set at the H level. The comparison result signal JDG is output from the amplification unit 31-n to be held by the memory 40-n, and also the comparison result signal JDG is used to control the switch SW4 constituting the amplification unit 31-n together with the signal φSW4. The switch SW4 turns off when both the signal φSW4 and the comparison result signal JDG are at the L level and turns on when one of the signal φSW4 and the comparison result signal JDG is at the H level. Therefore, when the signal φSW4 and the comparison result signal JDG are at the L level, the amplification factor of the amplification unit 31-n is determined by the ratio of the capacitance values of the capacitor element CIN1 and the capacitor element CFB3. On the other hand, when one of the signal φSW4 and the comparison result signal JDG is at the H level, the amplification factor of the amplification unit 31-n is set as the ratio of the capacitance value of the capacitor element CIN1 and the capacitance value of the sum of the capacitor element CFB3 and the capacitor element CFB4. Herein, the capacitance values of the capacitor element CIN1, the capacitor element CFB3, and the capacitor element CFB4 are respectively C, C/4, and 3C/4, and the amplification factor of the amplification unit 31-n is set as 4 times when the switch SW4 is off and set as 1 time when the switch SW4 is on.

Figure 19A:
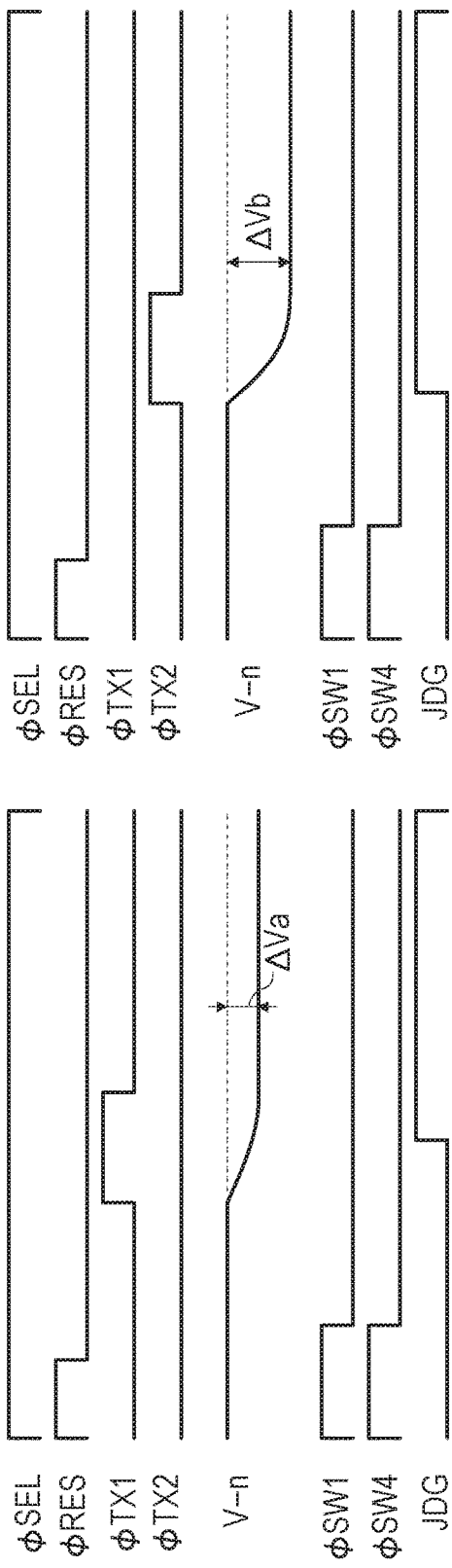
FIG. 19A illustrates the detail of the operation related to the pixel in one row of the imaging sensor.
Figure 19B:
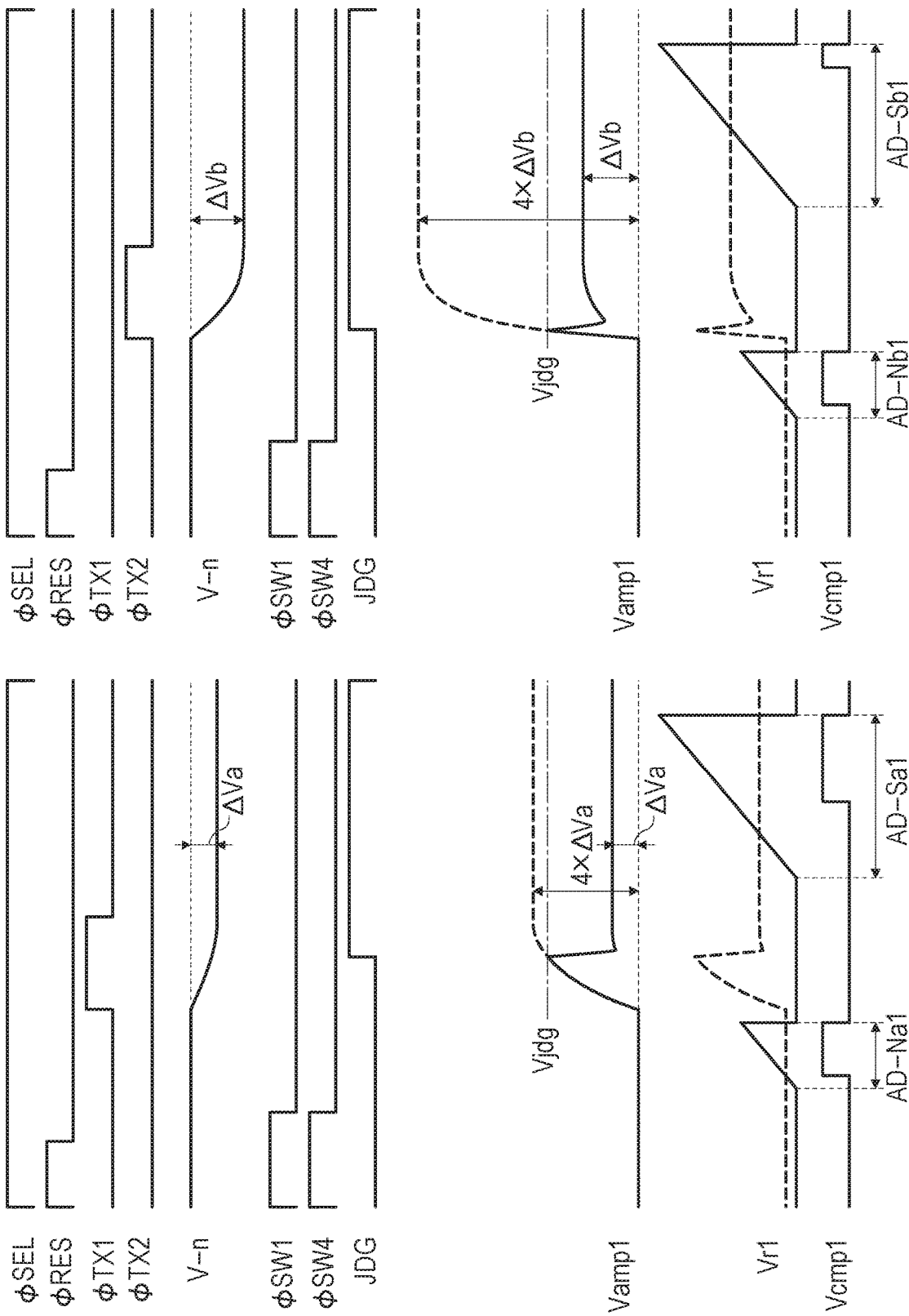
FIG. 19B illustrates the detail of the operation related to the pixel in one row of the imaging sensor.

FIGS. 19A and 19B are readout operation timing charts in one row according to the present exemplary embodiment. FIG. 19A is an operation timing chart during the period from the time t4 until the time t7 illustrated in FIG. 4, and FIG. 19B is an operation timing chart during the period from the time t10 until the time t11 illustrated in FIG. 4.

Descriptions will be given with reference to FIG. 19A. The timing generation circuit 70 sets both the signal φSW1 and the signal φSW4 at the H level. As a result, the capacitor element CIN1, the capacitor element CFB3, and the capacitor element CFB4 are reset. The timing generation circuit 70 resets the decision circuit 34 by a signal that is not illustrated in the drawing in parallel with the above-described operation. As a result, the decision circuit 34 outputs the L level as the comparison result signal JDG.

After the vertical scanning circuit 20 sets the signal φRES at the L level and the potential of the vertical signal line V-n is settled, the timing generation circuit 70 sets the signal φSW1 and the signal φSW4 at the L level. As a result, the amplification factor of the amplification unit 31-n becomes 4 times. In this state, the AD conversion unit performs the AD-Na1 conversion and obtains the digital signal Na1.

Subsequently, the signal φTX1 turns to the H level, and the signal ΔVa is input from the vertical signal line V-n to the amplification unit 31-n. The signal Vamp starts the change of the signal 4×ΔVa. At this time, the subsequent operation varies depending on whether or not the signal Vamp reaches the threshold Vjdg. FIG. 19A illustrates a case where the signal Vamp reaches the threshold Vjdg as an example.

When the signal Vamp1 reaches the threshold Vjdg of the decision circuit 34 or above, the decision circuit 34 holds the comparison result signal JDG at the H level and outputs the comparison result signal JDG. For this reason, the switch SW4 turns on, and the signal ΔVa amplified by the gain of 1 time is output for the signal Vamp1. The AD-Sa1 conversion is performed in this state, and the digital signal Sa1 is obtained. On the other hand, in a case where the signal Vamp does not reach the threshold Vjdg of the decision circuit 34, the decision circuit 34 holds the comparison result signal JDG at the L level as it is. Subsequently, the AD-Sa1 conversion is performed on the signal Vamp1 where the signal ΔVa amplified by the gain of 4 times is output, and the digital signal Sa1 is obtained. When the AD-Sa1 conversion is ended, the memory 40-n also holds the comparison result signal JDG together with the digital signal Na1 and the digital signal Sa1. As a result of the horizontal scanning by the horizontal scanning circuit 50, the digital signals Na1 and Sa1 and the comparison result signal JDG are transmitted from the memory 40-n in each column to the signal processing unit 60. The signal processing unit 60 performs the calculation processing on the digital signal Na1 and the digital signal Sa1 on the basis of the comparison result signal JDG. When the comparison result signal JDG is at the L level, the signal processing unit 60 outputs the digital signal Da1=Sa1−Na1 equivalent to the signal ΔVa. On the other hand, when the comparison result signal JDG is at the H level, the signal processing unit 60 outputs the digital signal Da1=4×(Sa1−Na1) equivalent to the signal 4×ΔVa.

In addition, the operation of FIG. 19B is the same as the operation of FIG. 19A except that the signal subjected to the AD conversion is set as the signal corresponding to the second accumulation period Texpb. When the comparison result signal JDG is at the L level, the signal processing unit 60 outputs the digital signal Db1=Sb1−Nb1 equivalent to the signal ΔVb. On the other hand, when the comparison result signal JDG is at the H level, the signal processing unit 60 outputs the digital signal Db1=4×(Sb1−Nb1) equivalent to the signal 4×ΔVb to the outside of the imaging sensor.

When the digital signals Da1 and Db1 obtained from the above-described operation are used, it is also possible to attain the same advantage as the first exemplary embodiment.

Seventh Exemplary Embodiment

A seventh exemplary embodiment will be described. Hereinafter, only a different aspect from the third exemplary embodiment will be described. The present exemplary embodiment is different from the third exemplary embodiment in that the signal Vamp1 output by the amplification unit 31-n is compared with the threshold and switches the ramp signal input to the comparison unit 32-n on the basis of a result of the comparison.

Figure 20:
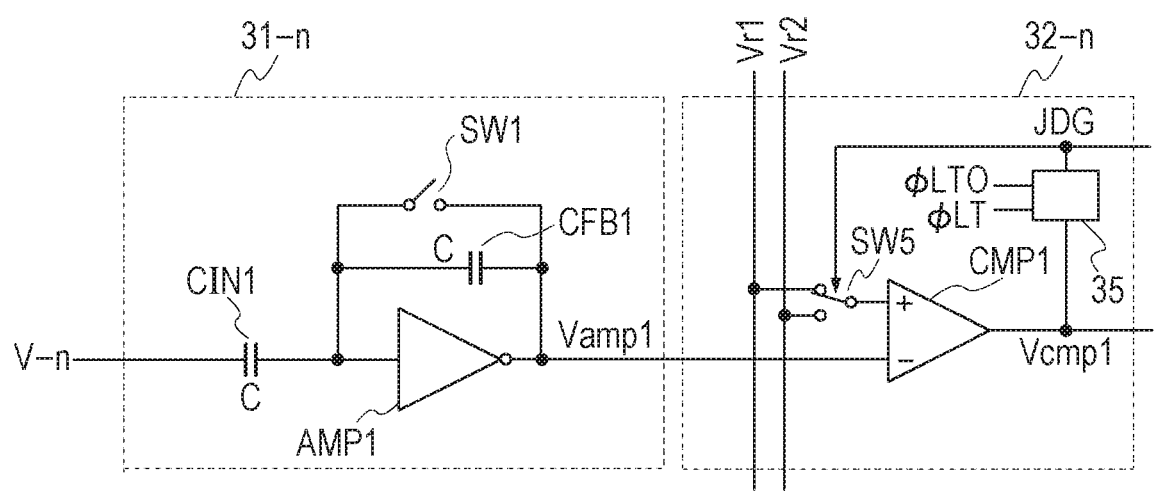
FIG. 20 illustrates the configurations of the amplification unit and the comparison unit.

The present exemplary embodiment is different from the third exemplary embodiment in the comparison unit 32-n. FIG. 20 illustrates the circuit in each column of the readout unit 30 according to the exemplary embodiment, that is, configurations of the amplification unit 31-n and the comparison unit 32-n.

The comparison unit 32-n according to the present exemplary embodiment is different from that of the third exemplary embodiment in the following three aspects. First, a holding circuit 35 is included. Second, the comparison unit 32-n does not include the comparison circuit CMP2. Third, the ramp signal Vr1 and the ramp signal Vr2 are input to the comparison circuit CMP1 via a switch SW5.

The holding circuit 35 holds the output signal Vcmp1 of the comparison circuit CMP1 at the timing when a signal φLT is switched from the H level to the L level. The held signal is output as the comparison result signal JDG, and an output timing of the signal is controlled by a signal φLTO. In a case where the signal φLTO is at the L level, the holding circuit 35 outputs the L level to the comparison result signal JDG. On the other hand, in a case where the signal φLTO is at the H level, the holding circuit 35 outputs the held signal level to the comparison result signal JDG. The comparison result signal JDG controls the switch SW5. When the comparison result signal JDG is at the L level, the ramp signal Vr2 is input to the comparison circuit CMP1. On the other hand, when the comparison result signal JDG is at the H level, the ramp signal Vr1 is input to the comparison circuit CMP1.

FIGS. 21A and 21B are readout operation timing charts in one row according to the present exemplary embodiment. FIG. 21A is an operation timing chart during the period from the time t4 until the time t7 illustrated in FIG. 4. FIG. 21B is an operation timing chart during the period from the time t10 until the time t11 illustrated in FIG. 4.

Descriptions will be given with reference to FIG. 21A. The signals φLT and φLTO are set at the L level at the same time when the signal φSEL turns to the H level and the row is selected. Therefore, the ramp signal Vr2 is input to the comparison circuit CMP1. In this state, similarly as in the third exemplary embodiment, the AD conversion unit performs the AD-Na1 conversion. Therefore, the digital signal Na1 multiplied by the AD conversion gain of 4 times with respect to the AD conversion using the ramp signal Vr1 is obtained by the gradient of the ramp signal Vr2. When the AD-Na1 conversion is ended, the ramp signal Vr2 increases to the threshold Vjdg.

Thereafter, the vertical scanning circuit 20 temporarily sets a signal φTX at the H level. Along with this, the S1+PN signal corresponding to the pixel signal based on the first accumulation period Texpa is output to the vertical signal line V-n. The amplification unit 31-n outputs the S1+Voff1 signal (signal ΔVa).

After the signal Vamp1 is settled as the potential of the S1+Voff1 signal, the timing generation circuit 70 temporarily sets the signal φLT at the H level. After the AD-Na1 conversion too, the comparison circuit CMP1 continues the comparison between the signal Vamp1 and the ramp signal Vr2, the holding circuit 35 of the comparison result holds the comparison result between the signal Vamp and the threshold Vjdg. Subsequently, the signal φLTO is set at the H level. In the subsequent operations, the ramp signal input to the comparison circuit CMP1 is selected in accordance with the comparison result between the signal Vamp and the threshold Vjdg.

The timing generation circuit 70 sets the signal φLTO at the H level. In this state, in a case where the comparison circuit CMP1 decides that the amplitude of the signal Vamp is higher than the threshold Vjdg, the comparison result signal JDG turns to the H level.

Therefore, the ramp signal Vr1 is input to the comparison circuit CMP1. In this state, the AD-Sa1 conversion is performed. As a result, the digital signal Sa1 multiplied by the AD conversion gain of 1 time is obtained by the gradient of the ramp signal Vr1.

On the other hand, in a case where the comparison circuit CMP1 decides that the amplitude of the signal Vamp is lower than the threshold Vjdg, the comparison result signal JDG turns to the L level. As a result, the ramp signal Vr2 is input to the comparison circuit CMP1. In this state, the AD-Sa1 conversion in a case where the comparison circuit CMP1 decides that the amplitude of. As a result, the digital signal Sa1 multiplied by the AD conversion gain of 4 times is obtained by the gradient of the ramp signal Vr2.

When the AD-Sa1 conversion is ended, the memory 40-n holds the comparison result signal JDG together with the digital signal Na1 and the digital signal Sa1. The digital signals Na1 and Sa1 and the comparison result signal JDG are transmitted from the memory 40-n in each column to the signal processing unit 60 by the horizontal scanning circuit 50. The signal processing unit 60 performs the calculation processing on the digital signal Na1 and the digital signal Sa1 on the basis of the comparison result signal JDG. In a case where the comparison result signal JDG is at the L level, the digital signal Da1=Sa1−Na1 equivalent to the signal ΔVa is output. On the other hand, in a case where the comparison result signal JDG is at the H level, the signal processing unit 60 outputs the digital signal Da1=4×Sa1−Na1 equivalent to the signal 4×ΔVa.

In addition, the operation of FIG. 21B is the same as the operation of FIG. 21A except that the signal subjected to the AD conversion is set as the signal corresponding to the second accumulation period Texpb. In a case where the comparison result signal JDG is at the L level, the signal processing unit 60 outputs the digital signal Db1=Sb1−Nb1 equivalent to the signal ΔVb to the outside of the imaging sensor. On the other hand, in a case where the comparison result signal JDG is at the H level, the signal processing unit 60 outputs the digital signal Db1=4×Sb1−Nb1 equivalent to the signal 4×ΔVb to the outside of the imaging sensor.

When the digital signals Da1 and Db1 obtained from the above-described operation are used, the imaging sensor according to the present exemplary embodiment can also attain the same advantage as the first exemplary embodiment.

It should be noted that, according to the present exemplary embodiment, the comparison circuit CMP1 in each column generates the comparison result signal JDG indicating the result of the comparison between the threshold Vjdg and the signal Vamp1. As another example, the comparison result signal JDG generated by the single comparison circuit CMP1 may be shared by a plurality of comparison circuits CMP1. The adjacent comparison circuits CMP1 preferably share the single comparison result signal JDG. This is because the adjacent pixels 11 tend to have amplitudes of the pixel signals at substantially close levels.

Eighth Exemplary Embodiment

The present exemplary embodiment relates to the imaging system including the imaging sensor according to the respective exemplary embodiment described above.

Figure 22:
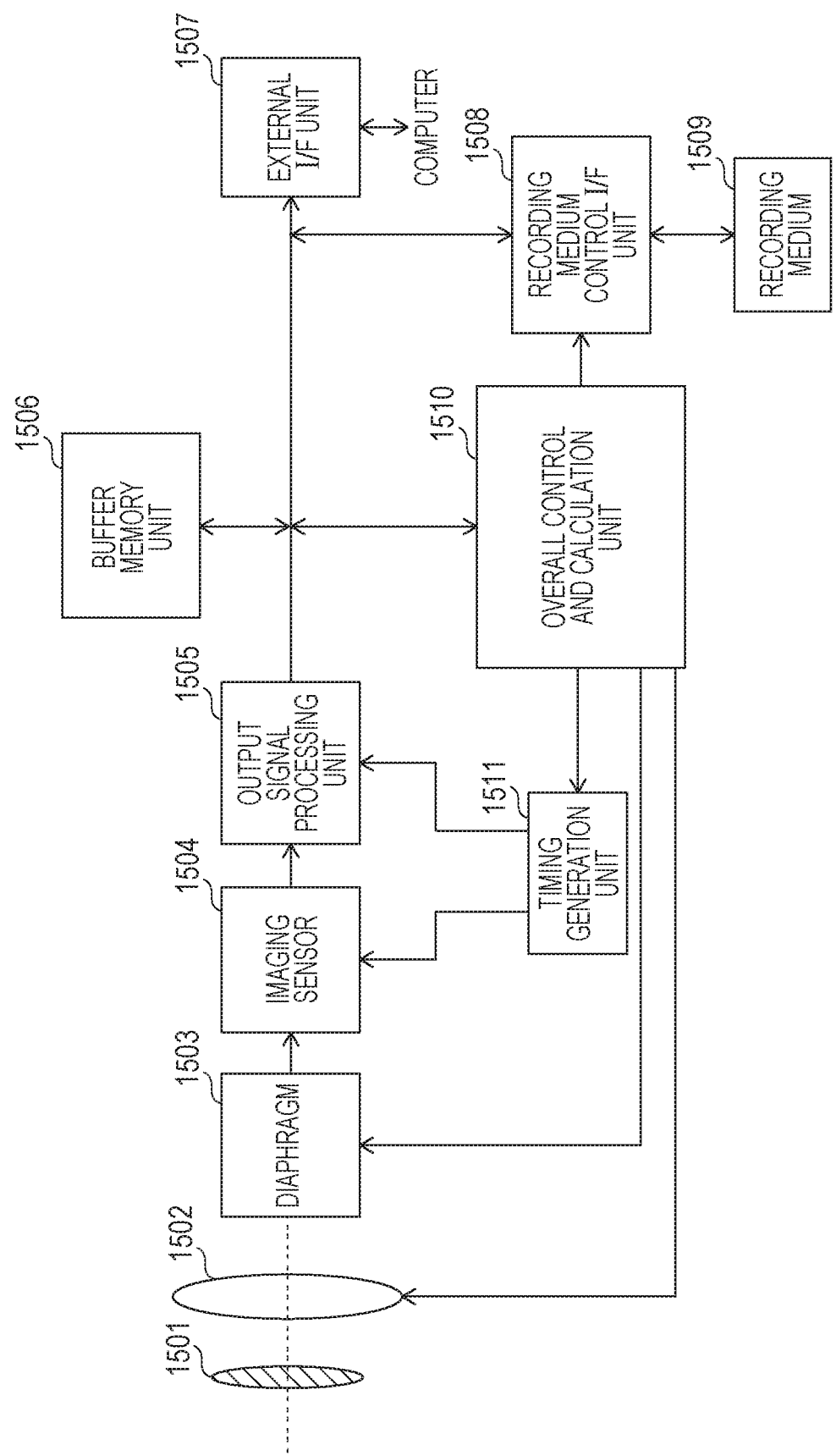
FIG. 22 illustrates a configuration of the imaging system.

A digital still camera, a digital camcorder, a security camera, and the like are used as the imaging system. FIG. 22 is a schematic diagram of a case where the imaging sensor is applied to the digital still camera as an example of the imaging system.

The imaging system exemplified in FIG. 22 includes a barrier 1501 that protects a lens, a lens 1502 that focuses an optical image of an object on an imaging sensor 1504, and a diaphragm 1503 that can vary the amount of light that passes through the lens 1502. The lens 1502 and the diaphragm 1503 are an optical system configured to condense light on the imaging sensor 1504. The imaging sensor 1504 is one of the imaging sensors according to the respective exemplary embodiments described above. The imaging system exemplified in FIG. 22 also includes an output signal processing unit 1505 configured to perform processing on an output signal output from the imaging sensor 1504. The output signal processing unit 1505 performs an operation for outputting a signal by performing various corrections and compression when necessary.

The output signal processing unit 1505 performs an operation for generating an image by using the digital signal output by the imaging sensor according to the first to seventh exemplary embodiments. The image obtained at this time corresponds to one in which the dynamic range is expanded by using the signal output by the imaging sensor according to the first to seventh exemplary embodiments.

The imaging system exemplified in FIG. 22 further includes a buffer memory unit 1506 configured to temporarily store image data and an external interface unit 1507 configured to communicate with an external computer or the like. The imaging system further includes a removable recording medium 1509 such as a semiconductor memory configured to perform recording or readout of imaging data and a recording medium control interface unit 1508 configured to perform recording or readout with respect to the recording medium 1509. The imaging system further includes an overall control calculation unit 1510 configured to perform various calculations and control the entirety of the digital still camera and a timing supply unit 1511 configured to output various timing signals to the imaging sensor 1504 and the output signal processing unit 1505. Herein, the timing signals and the like may be input from the outside, and it is sufficient when the imaging system includes at least the imaging sensor 1504 and the output signal processing unit 1505 configured to process the output signal output from the imaging sensor 1504.

The output signal processing unit 1505 is provided on a second semiconductor substrate that is different from a first semiconductor substrate on which the imaging sensor 1504 is formed. The first semiconductor substrate and the second semiconductor substrate may be respectively separate chips or may be a single chip by laminating the first semiconductor substrate and the second semiconductor substrate.

As described above, the imaging system according to the present exemplary embodiment can perform the imaging operation by applying the imaging sensor 1504 to the imaging system.

Ninth Exemplary Embodiment

Figure 23A:
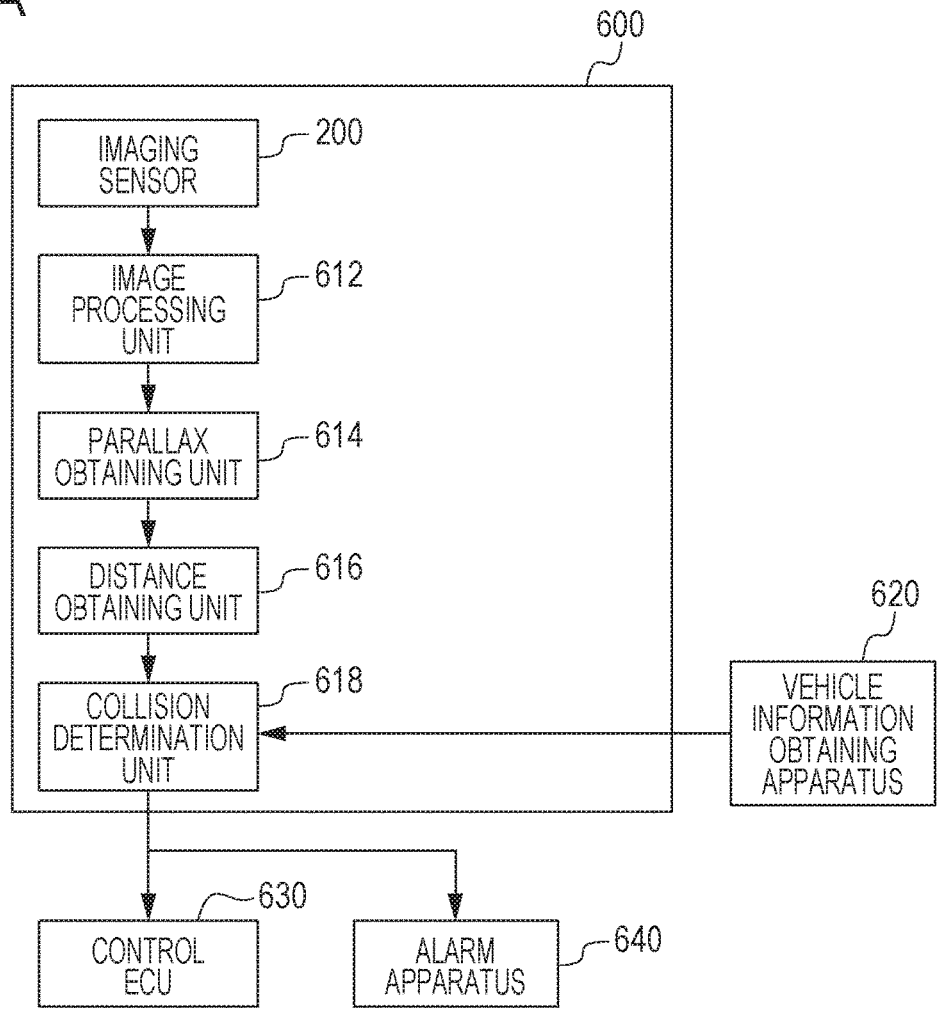
FIGS. 23A and 23B illustrate configurations of the imaging sensor and a moving body.
Figure 23B:
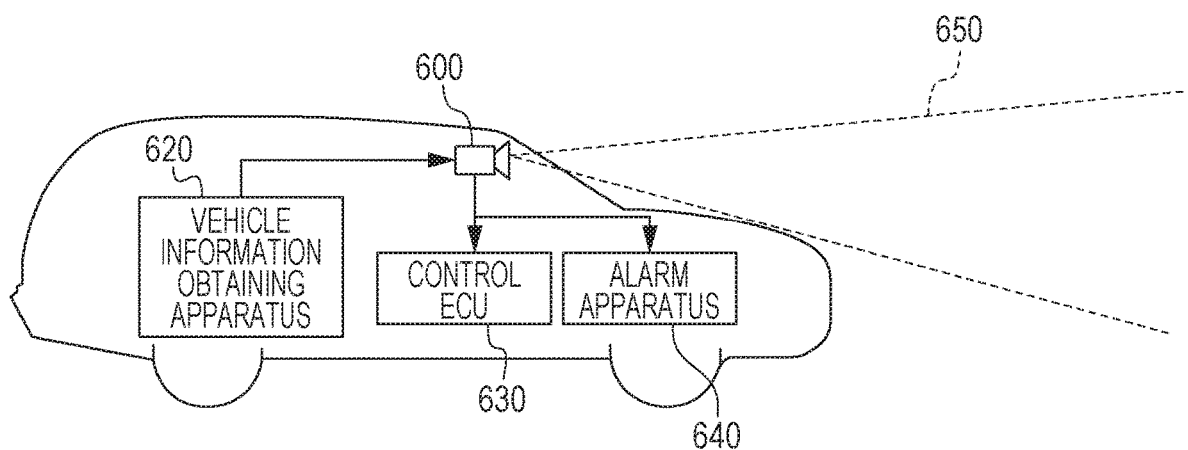

FIGS. 23A and 23B illustrate configurations of an imaging system 600 and a moving body according to the present exemplary embodiment. The moving body may be a structure that moves such as a vehicle. FIG. 23A illustrates an example of the imaging system 600 related to an in-vehicle camera. The imaging system 600 includes a solid-state imaging sensor 200. The solid-state imaging sensor 200 is one of the imaging sensors according to the respective exemplary embodiments described above. The imaging system 600 includes an image processing unit 612 configured to perform image processing on plural pieces of image data obtained by the solid-state imaging sensor 200 and a parallax obtaining unit 614 configured to calculate a parallax (phase difference of the parallax images) on the basis of the plural pieces of image data obtained by the imaging system 600. The imaging system 600 also includes a distance obtaining unit 616 configured to calculate a distance to a target object on the basis of the calculated parallax and a collision determination unit 618 configured to determine whether or not a collision probability exists on the basis of the calculated distance. Herein, the parallax obtaining unit 614 and the distance obtaining unit 616 are examples of a distance information obtaining unit configured to obtain distance information to the target object. That is, the distance information refers to information on the parallax, the defocusing amount, the distance to the target object, or the like. The collision determination unit 618 may determine the collision probability by using any of these pieces of distance information. The distance information obtaining unit may be realized by dedicatedly designed hardware or may also be realized by software module. In addition, the distance information obtaining unit may be realized by a field programmable gate array (FPGA), an application specific integrated circuit (ASIC), or the like or may also be realized by any combination of these elements.

The imaging system 600 is connected to a vehicle information obtaining apparatus 620 and can obtain vehicle information such as a vehicle speed, a yaw rate, or a rudder angle. A control electrical control unit (ECU) 630 corresponding to a control apparatus configured to output a control signal for generating braking force to the vehicle on the basis of the determination result in the collision determination unit 618 is also connected to the imaging system 600. That is, the control ECU 630 is an example of a moving body control unit configured to control the moving body on the basis of distance information. An alarm apparatus 640 configured to issue a warning to a driver on the basis of the determination result in the collision determination unit 618 is also connected to the imaging system 600. For example, in a case where the collision probability is high as the determination result in the collision determination unit 618, the control ECU 630 performs vehicle control to avoid a collision or alleviate a damage by applying a brake, releasing an accelerator, suppressing an engine output, or the like. The alarm apparatus 640 issues a warning to a user by sounding an alarm such as sound, displaying warning information on a screen such as a car navigation system, vibrating a seat belt or steering, or the like.

According to the present exemplary embodiment, a surrounding of the vehicle such as, for example, a forward area or a backward area is imaged by the imaging system 600. FIG. 23B illustrates the imaging system 600 in a case where the forward area (imaging range 650) of the vehicle is imaged. The vehicle information obtaining apparatus 620 transmits an instruction such that the imaging system 600 is operated to execute the imaging. When the imaging sensor according to the respective exemplary embodiments described above is used as the solid-state imaging sensor 200, the imaging system 600 according to the present exemplary embodiment can improve the accuracy of the focusing.

In the above explanations, the example of the control for avoiding the collision with the other vehicle has been described, but the present exemplary embodiment can also be applied to control for following the other vehicle to perform automated driving, control for the automated driving without drifting from a lane, or the like. Furthermore, the imaging system can be applied to not only the vehicle such as an automobile but also a moving body (moving apparatus) such as, for example, a vessel, aircraft, or industrial robot. In addition, the imaging system can be widely applied to not only the moving body but also a device using object recognition such as an intelligent transport system (ITS).

It should be noted that the above-described exemplary embodiments are all merely specific examples for carrying out the disclosure, and the technical scope of the disclosure is not to be construed to a limited extent by these exemplary embodiments. That is, the disclosure can be carried out in various forms without departing from the technical concept or the main features. In addition, the disclosure can be carried out by combining the above-described respective exemplary embodiments in various manners.

Since the disclosure has discussed the amplification factor of the column circuit unit to which the signal output from the pixel is input, it is possible to output the signal in which the dynamic range can be expanded in the imaging sensor provided with the global electronic shutter.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising:
a plurality of circuits each configured to generate a signal obtained by amplifying a signal output from corresponding one of a plurality of pixels each including a photoelectric conversion unit,
wherein the photoelectric conversion unit respectively accumulates signals during each of a first accumulation period and a second accumulation period that is a period established separately from the first accumulation period and longer than the first accumulation period,
wherein the signal corresponding to the first accumulation period and the signal corresponding to the second accumulation period are input in each of the plurality of circuits from the corresponding pixel,
wherein each of the plurality of circuits generates a comparison result signal indicating a result of a comparison of the signal corresponding to the first accumulation period with a threshold,
wherein, in a case where the comparison result signal indicates that an amplitude of the signal corresponding to the first accumulation period is larger than an amplitude of the threshold, an amplification factor for amplifying the signal corresponding to the first accumulation period is set as a first amplification factor, and
wherein, in a case where the comparison result signal indicates that an amplitude of the signal corresponding to the first accumulation period is smaller than an amplitude of the threshold, the amplification factor for amplifying the signal corresponding to the first accumulation period is set as a second amplification factor that is higher than the first amplification factor.

2. The apparatus according to claim 1,
wherein each of the plurality of circuits includes an analog-to-digital (AD) conversion unit configured to respectively convert the signal corresponding to the first accumulation period and the signal corresponding to the second accumulation period into digital signals, and
wherein each of the first amplification factor and the second amplification factor is an AD conversion gain of the AD conversion unit.

3. The apparatus according to claim 1,
wherein each of the plurality of circuits includes an amplification circuit configured to respectively amplify the signal corresponding to the first accumulation period and the signal corresponding to the second accumulation period, and
wherein each of the first amplification factor and the second amplification factor is an amplification factor of the amplification circuit.

4. The apparatus according to claim 1, further comprising a control unit,
wherein the control unit respectively sets start and end of signal transfer from the photoelectric conversion unit to a signal holding unit by a transfer unit at the same time in the plurality of pixels.

5. An imaging system comprising:
the apparatus according to claim 1; and
a signal processing unit configured to generate an image by processing a signal output from the apparatus.

6. A moving body comprising:
the apparatus according to claim 1;
a distance information obtaining unit configured to obtain distance information to an object on a basis of a parallax image based on a signal from the apparatus; and
a moving body control unit configured to control the moving body on a basis of the distance information.

7. An apparatus comprising:
a plurality of circuits arranged in a plurality of columns and each configured to generate a signal obtained by amplifying a signal output from corresponding one of a plurality of pixels each including a photoelectric conversion unit,
wherein the photoelectric conversion unit respectively accumulates signals during each of a first accumulation period and a second accumulation period that is a period established separately from the first accumulation period and longer than the first accumulation period,
wherein the signal corresponding to the first accumulation period and the signal corresponding to the second accumulation period are input in each of the plurality of circuits from the corresponding pixel,
wherein each of the plurality of circuits generates a comparison result signal indicating a result of a comparison of the signal corresponding to the second accumulation period with a threshold,
wherein, in a case where the comparison result signal indicates that an amplitude of the signal corresponding to the second accumulation period is larger than an amplitude of the threshold, an amplification factor for amplifying the signal corresponding to the second accumulation period is set as a third amplification factor, and
wherein, in a case where the comparison result signal indicates that an amplitude of the signal corresponding to the second accumulation period is smaller than an amplitude of the threshold, the amplification factor for amplifying the signal corresponding to the second accumulation period is set as a fourth amplification factor that is higher than the third amplification factor.

8. The apparatus according to claim 7,
wherein each of the plurality of circuits includes an AD conversion unit configured to respectively convert the signal corresponding to the first accumulation period and the signal corresponding to the second accumulation period into digital signals, and
wherein each of the third amplification factor and the fourth amplification factor is an AD conversion gain of the AD conversion unit.

9. The apparatus according to claim 7,
wherein each of the plurality of circuits includes an amplification circuit configured to respectively amplify the signal corresponding to the first accumulation period and the signal corresponding to the second accumulation period, and
wherein each of the third amplification factor and the fourth amplification factor is an amplification factor of the amplification circuit.

10. The apparatus according to claim 7, further comprising a control unit,
wherein the control unit respectively sets start and end of signal transfer from the photoelectric conversion unit to a signal holding unit by a transfer unit at the same time in the plurality of pixels.

11. An imaging system comprising:
the apparatus according to claim 7; and
a signal processing unit configured to generate an image by processing a signal output from the apparatus.

12. A moving body comprising:
the apparatus according to claim 7;
a distance information obtaining unit configured to obtain distance information to an object on a basis of a parallax image based on a signal from the apparatus; and
a moving body control unit configured to control the moving body on a basis of the distance information.

13. An apparatus comprising:
a plurality of circuits arranged in a plurality of columns and each configured to generate a signal obtained by amplifying a signal output from corresponding one of a plurality of pixels each including a photoelectric conversion unit,
wherein the photoelectric conversion unit respectively accumulates signals during each of a first accumulation period and a second accumulation period that is a period established separately from the first accumulation period and longer than the first accumulation period,
wherein the signal corresponding to the first accumulation period and the signal corresponding to the second accumulation period are input in each of the plurality of circuits from the corresponding pixel,
wherein each of the plurality of circuits generates a first comparison result signal indicating a result of a comparison between an amplitude of the signal corresponding to the first accumulation period and an amplitude of a threshold and a second comparison result signal indicating a result of a comparison between an amplitude of the signal corresponding to the second accumulation period and an amplitude of the threshold as comparison result signals,
wherein, in a case where the first comparison result signal indicates that an amplitude of the signal corresponding to the first accumulation period is larger than an amplitude of the threshold, an amplification factor for amplifying the signal corresponding to the first accumulation period is set as a first amplification factor,
wherein, in a case where the first comparison result signal indicates that an amplitude of the signal corresponding to the first accumulation period is smaller than an amplitude of the threshold, the amplification factor for amplifying the signal corresponding to the first accumulation period is set as a second amplification factor that is higher than the first amplification factor,
wherein, in a case where the second comparison result signal indicates that an amplitude of the signal corresponding to the second accumulation period is larger than an amplitude of the threshold, the amplification factor for amplifying the signal corresponding to the second accumulation period is set as the first amplification factor, and
wherein, in a case where the second comparison result signal indicates that an amplitude of the signal corresponding to the second accumulation period is smaller than an amplitude of the threshold, the amplification factor for amplifying the signal corresponding to the second accumulation period is set as the second amplification factor.

14. The apparatus according to claim 13,
wherein each of the plurality of circuits includes an AD conversion unit configured to respectively convert the signal corresponding to the first accumulation period and the signal corresponding to the second accumulation period into digital signals, and
wherein each of the first amplification factor and the second amplification factor is an AD conversion gain of the AD conversion unit.

15. The apparatus according to claim 13,
wherein each of the plurality of circuits includes an amplification circuit configured to respectively amplify the signal corresponding to the first accumulation period and the signal corresponding to the second accumulation period, and
wherein each of the first amplification factor and the second amplification factor is an amplification factor of the amplification circuit.

16. The apparatus according to claim 13, further comprising a control unit,
wherein the control unit respectively sets start and end of signal transfer from the photoelectric conversion unit to a signal holding unit by a transfer unit at the same time in the plurality of pixels.

17. An imaging system comprising:
the apparatus according to claim 13; and
a signal processing unit configured to generate an image by processing a signal output from the apparatus.

18. A moving body comprising:
the apparatus according to claim 13;
a distance information obtaining unit configured to obtain distance information to an object on a basis of a parallax image based on a signal from the apparatus; and
a moving body control unit configured to control the moving body on a basis of the distance information.

19. An imaging system comprising:
a plurality of circuits arranged in a plurality of columns and each configured to generate a signal obtained by amplifying a signal output from corresponding one of a plurality of pixels each including a photoelectric conversion unit,
wherein the photoelectric conversion unit respectively accumulates signals during each of a first accumulation period and a second accumulation period that is a period established separately from the first accumulation period and longer than the first accumulation period, wherein the signal corresponding to the first accumulation period and the signal corresponding to the second accumulation period are input in each of the plurality of circuits from the corresponding pixel, wherein each of the plurality of circuits includes an amplification circuit, and wherein the amplification circuit included in each of the plurality of circuits outputs a first signal, a second signal, a third signal and a fourth signal, the first signal and the second signal being generated by amplifying the signal corresponding to the first accumulation period by a plurality of amplification factors having different values, the third signal and the fourth signal being generated by amplifying the signal corresponding to the second accumulation period by a plurality of amplification factors having different values, wherein the imaging system further comprises a signal processing unit configured to generate an image using the signal output from the plurality of circuits, wherein, depending on which one of an upper limit and a lower limit of a dynamic range of a signal output from the plurality of circuits is to be expanded, or depending on whether both the upper limit and the lower limit of the dynamic range are to be expanded or only one of the upper limit and the lower limit of the dynamic range is to be expanded, the signal processing unit selects the signal to be used for generating the image from among the first signal, the second signal, the third signal, and the fourth signal.

20. The system according to claim 19, further comprising a control unit, wherein the control unit respectively sets start and end of signal transfer from the photoelectric conversion unit to a signal holding unit by a transfer unit at the same time in the plurality of pixels.

21. The imaging system according to claim 19, wherein an amplification factor used for generating the first signal is higher than an amplification factor used for generating the second signal, and wherein, in a case where the lower limit only of the dynamic range is to be expanded, the signal processing unit selects the second signal, the third signal, and the fourth signal as the signal to be used for generating the image.

22. A moving body comprising:
the system according to claim 19;
a distance information obtaining unit configured to obtain distance information to an object on a basis of a parallax image based on a signal from the plurality of circuits; and
a moving body control unit configured to control the moving body on a basis of the distance information.

23. An imaging system comprising:
a plurality of circuits arranged in a plurality of columns and each configured to generate a signal obtained by amplifying a signal output from corresponding one of a plurality of pixels each including a photoelectric conversion unit, wherein the photoelectric conversion unit respectively accumulates signals during each of a first accumulation period and a second accumulation period that is a period established separately from the first accumulation period and longer than the first accumulation period, wherein the signal corresponding to the first accumulation period and the signal corresponding to the second accumulation period are input in each of the plurality of circuits from the corresponding pixel, wherein each of the plurality of circuits includes an AD conversion circuit configured to respectively perform AD conversion of the signal corresponding to the first accumulation period and the signal corresponding to the second accumulation period which are output from the corresponding pixel, and wherein the AD conversion unit included in each of the plurality of circuits outputs a first signal, a second signal, a third signal and a fourth signal, the first signal and the second signal being generated by converting the signal corresponding to the first accumulation period by a plurality of AD conversion gain factors having different values, the third signal and the fourth signal being generated by converting the signal corresponding to the second accumulation period by a plurality of AD conversion gain factors having different values, wherein the imaging system further comprises a signal processing unit configured to generate an image using the signal output from the plurality of circuits, wherein, depending on which one of an upper limit and a lower limit of a dynamic range of a signal output from the plurality of circuits is to be expanded, or depending on whether both the upper limit and the lower limit of the dynamic range are to be expanded or only one of the upper limit and the lower limit of the dynamic range is to be expanded, the signal processing unit selects the signal to be used for generating the image from among the first signal, the second signal, the third signal, and the fourth signal.

24. The imaging system according to claim 23, further comprising a control unit, wherein the control unit respectively sets start and end of signal transfer from the photoelectric conversion unit to a signal holding unit by a transfer unit at the same time in the plurality of pixels.

25. The imaging system according to claim 23, wherein an amplification factor used for generating the first signal is higher than an amplification factor used for generating the second signal, and wherein, in a case where the lower limit only of the dynamic range is to be expanded, the signal processing unit selects the second signal, the third signal, and the fourth signal as the signal to be used for generating the image.

26. A moving body comprising:
the system according to claim 23;
a distance information obtaining unit configured to obtain distance information to an object on a basis of a parallax image based on a signal from the imaging sensor; and
a moving body control unit configured to control the moving body on a basis of the distance information.

27. A substrate comprising:
a plurality of circuits each configured to generate a signal obtained by amplifying a signal output from corresponding one of a plurality of pixels each including a photoelectric conversion unit, wherein the photoelectric conversion unit respectively accumulates signals during each of a first accumulation period and a second accumulation period that is a period established separately from the first accumulation period and longer than the first accumulation period, wherein the signal corresponding to the first accumulation period and the signal corresponding to the second accumulation period are input in each of the plurality of circuits from the corresponding pixel, wherein each of the plurality of circuits generates a comparison result signal indicating a result of a comparison of the signal corresponding to the first accumulation period with a threshold, wherein, in a case where the comparison result signal indicates that an amplitude of the signal corresponding to the first accumulation period is larger than an amplitude of the threshold, an amplification factor for amplifying the signal corresponding to the first accumulation period is set as a first amplification factor, and wherein, in a case where the comparison result signal indicates that an amplitude of the signal corresponding to the first accumulation period is smaller than an amplitude of the threshold, the amplification factor for amplifying the signal corresponding to the first accumulation period is set as a second amplification factor that is higher than the first amplification factor.

28. The substrate according to claim 27,
wherein each of the plurality of circuits includes an analog-to-digital (AD) conversion unit configured to respectively convert the signal corresponding to the first accumulation period and the signal corresponding to the second accumulation period into digital signals, and
wherein each of the first amplification factor and the second amplification factor is an AD conversion gain of the AD conversion unit.

29. The substrate according to claim 27,
wherein each of the plurality of circuits includes an amplification circuit configured to respectively amplify the signal corresponding to the first accumulation period and the signal corresponding to the second accumulation period, and
wherein each of the first amplification factor and the second amplification factor is an amplification factor of the amplification circuit.

30. The substrate according to claim 27, further comprising a control unit,
wherein the control unit respectively sets start and end of signal transfer from the photoelectric conversion unit to a signal holding unit by a transfer unit at the same time in the plurality of pixels.

31. An imaging system comprising:
the substrate according to claim 27; and
a signal processing unit configured to generate an image by processing a signal output from the substrate.

32. A moving body comprising:
the substrate according to claim 27;
a distance information obtaining unit configured to obtain distance information to an object on a basis of a parallax image based on a signal from the substrate; and
a moving body control unit configured to control the moving body on a basis of the distance information.

33. A substrate comprising:
a plurality of circuits arranged in a plurality of columns and each configured to generate a signal obtained by amplifying a signal output from corresponding one of a plurality of pixels each including a photoelectric conversion unit, wherein the photoelectric conversion unit respectively accumulates signals during each of a first accumulation period and a second accumulation period that is a period established separately from the first accumulation period and longer than the first accumulation period, wherein the signal corresponding to the first accumulation period and the signal corresponding to the second accumulation period are input in each of the plurality of circuits from the corresponding pixel, wherein each of the plurality of circuits generates a comparison result signal indicating a result of a comparison of the signal corresponding to the second accumulation period with a threshold, wherein, in a case where the comparison result signal indicates that an amplitude of the signal corresponding to the second accumulation period is larger than an amplitude of the threshold, an amplification factor for amplifying the signal corresponding to the second accumulation period is set as a third amplification factor, and wherein, in a case where the comparison result signal indicates that an amplitude of the signal corresponding to the second accumulation period is smaller than an amplitude of the threshold, the amplification factor for amplifying the signal corresponding to the second accumulation period is set as a fourth amplification factor that is higher than the third amplification factor.

34. The substrate according to claim 33,
wherein each of the plurality of circuits includes an analog-to-digital (AD) conversion unit configured to respectively convert the signal corresponding to the first accumulation period and the signal corresponding to the second accumulation period into digital signals, and
wherein each of the first amplification factor and the second amplification factor is an AD conversion gain of the AD conversion unit.

35. The substrate according to claim 33,
wherein each of the plurality of circuits includes an amplification circuit configured to respectively amplify the signal corresponding to the first accumulation period and the signal corresponding to the second accumulation period, and
wherein each of the first amplification factor and the second amplification factor is an amplification factor of the amplification circuit.

36. The substrate according to claim 33, further comprising a control unit,
wherein the control unit respectively sets start and end of signal transfer from the photoelectric conversion unit to a signal holding unit by a transfer unit at the same time in the plurality of pixels.

37. An imaging system comprising:
the substrate according to claim 33; and
a signal processing unit configured to generate an image by processing a signal output from the substrate.

38. A moving body comprising:
the substrate according to claim 33;
a distance information obtaining unit configured to obtain distance information to an object on a basis of a parallax image based on a signal from the substrate; and
a moving body control unit configured to control the moving body on a basis of the distance information.

39. A substrate comprising:
a plurality of circuits arranged in a plurality of columns and each configured to generate a signal obtained by amplifying a signal output from corresponding one of a plurality of pixels each including a photoelectric conversion unit,
wherein the photoelectric conversion unit respectively accumulates signals during each of a first accumulation period and a second accumulation period that is a period established separately from the first accumulation period and longer than the first accumulation period,
wherein the signal corresponding to the first accumulation period and the signal corresponding to the second accumulation period are input in each of the plurality of circuits from the corresponding pixel,
wherein each of the plurality of circuits generates a first comparison result signal indicating a result of a comparison between an amplitude of the signal corresponding to the first accumulation period and an amplitude of a threshold and a second comparison result signal indicating a result of a comparison between an amplitude of the signal corresponding to the second accumulation period and an amplitude of the threshold as comparison result signals,
wherein, in a case where the first comparison result signal indicates that an amplitude of the signal corresponding to the first accumulation period is larger than an amplitude of the threshold, an amplification factor for amplifying the signal corresponding to the first accumulation period is set as a first amplification factor,
wherein, in a case where the first comparison result signal indicates that an amplitude of the signal corresponding to the first accumulation period is smaller than an amplitude of the threshold, the amplification factor for amplifying the signal corresponding to the first accumulation period is set as a second amplification factor that is higher than the first amplification factor,
wherein, in a case where the second comparison result signal indicates that an amplitude of the signal corresponding to the second accumulation period is larger than an amplitude of the threshold, the amplification factor for amplifying the signal corresponding to the second accumulation period is set as the first amplification factor, and
wherein, in a case where the second comparison result signal indicates that an amplitude of the signal corresponding to the second accumulation period is smaller than an amplitude of the threshold, the amplification factor for amplifying the signal corresponding to the second accumulation period is set as the second amplification factor.

40. The substrate according to claim 39,
wherein each of the plurality of circuits includes an analog-to-digital (AD) conversion unit configured to respectively convert the signal corresponding to the first accumulation period and the signal corresponding to the second accumulation period into digital signals, and
wherein each of the first amplification factor and the second amplification factor is an AD conversion gain of the AD conversion unit.

41. The substrate according to claim 39,
wherein each of the plurality of circuits includes an amplification circuit configured to respectively amplify the signal corresponding to the first accumulation period and the signal corresponding to the second accumulation period, and
wherein each of the first amplification factor and the second amplification factor is an amplification factor of the amplification circuit.

42. The substrate according to claim 39, further comprising a control unit,
wherein the control unit respectively sets start and end of signal transfer from the photoelectric conversion unit to a signal holding unit by a transfer unit at the same time in the plurality of pixels.

43. An imaging system comprising:
the substrate according to claim 39; and
a signal processing unit configured to generate an image by processing a signal output from the substrate.

44. A moving body comprising:
the substrate according to claim 39;
a distance information obtaining unit configured to obtain distance information to an object on a basis of a parallax image based on a signal from the substrate; and
a moving body control unit configured to control the moving body on a basis of the distance information.

* * * * *